United States Patent
Lee et al.

(10) Patent No.: US 11,594,438 B2
(45) Date of Patent: Feb. 28, 2023

(54) SEMICONDUCTOR MANUFACTURING DEVICE TO SECURELY HOLD SEMICONDUCTOR PANELS FOR TRANSPORT AND MANUFACTURING PROCESSES

(71) Applicant: STATS ChipPAC Pte. Ltd., Singapore (SG)

(72) Inventors: Hyeonchul Lee, Incheon (KR); Kyounghee Park, Seoul (KR); Kyunghwan Kim, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/339,210

(22) Filed: Jun. 4, 2021

(65) Prior Publication Data
US 2022/0392795 A1 Dec. 8, 2022

(51) Int. Cl.
*H01L 21/673* (2006.01)

(52) U.S. Cl.
CPC .. *H01L 21/67373* (2013.01); *H01L 21/67363* (2013.01); *H01L 21/67369* (2013.01); *H01L 21/67379* (2013.01)

(58) Field of Classification Search
CPC ........... H01L 21/6732; H01L 21/67383; H01L 21/67373; H01L 21/67379; H01L 21/67369; H01L 21/67363; B65D 25/107; H05K 13/0069
USPC ....... 206/710–712, 732, 723, 722, 452, 454, 206/449, 425
See application file for complete search history.

(56) References Cited

U.S. PATENT DOCUMENTS

| | | | | |
|---|---|---|---|---|
| 2,953,253 A * | 9/1960 | Henderson | ............. | B65D 85/48 206/448 |
| 4,228,902 A * | 10/1980 | Schulte | ............... | H01L 21/6732 211/41.18 |
| 4,351,448 A * | 9/1982 | Ingersoll | ................ | A45C 13/28 206/508 |
| 5,638,958 A * | 6/1997 | Sanchez | ............. | H01L 21/6732 211/41.12 |

(Continued)

FOREIGN PATENT DOCUMENTS

| | | | |
|---|---|---|---|
| KR | 100716418 B1 | 5/2007 | |
| KR | 101185452 B1 | 10/2012 | |

*Primary Examiner* — Chun Hoi Cheung
(74) *Attorney, Agent, or Firm* — Robert D. Atkins; Patent Law Group: Atkins and Associates, P.C.

(57) ABSTRACT

A semiconductor manufacturing equipment has an outer case housing including a lower case extension to support a semiconductor panel. The lower case extension is fixed in position within the outer case housing. An inner case housing having an upper case extension is disposed within the outer case housing in proximity to the lower case extension. A mechanism draws the upper case extension toward the lower case extension and locks the semiconductor panel in place between the upper case extension and lower case extension. The mechanism has a cam assembly disposed above the inner case housing and operatable with a handle to rotate the cam assembly and apply pressure to the inner case housing and upper case extension to lock the semiconductor panel in place between the upper case extension and lower case extension. A spring or other elastic mechanism is disposed under the inner case housing to load the pressure.

21 Claims, 14 Drawing Sheets

(56) References Cited

U.S. PATENT DOCUMENTS

| | | | | |
|---|---|---|---|---|
| 5,853,214 A * | 12/1998 | Babbs | ................ | H01L 21/6734 |
| | | | | 211/41.18 |
| 5,960,960 A * | 10/1999 | Yamamoto | ........ | H01L 21/67326 |
| | | | | 211/41.18 |
| 7,086,540 B2 * | 8/2006 | Huang | ................ | H01L 21/6734 |
| | | | | 211/41.18 |
| 7,172,927 B2 | 2/2007 | Yuan et al. | | |
| 7,225,934 B2 * | 6/2007 | Shon | ................ | H01L 21/6734 |
| | | | | 211/41.18 |
| 7,500,564 B2 * | 3/2009 | Choi | ................ | H01L 21/67383 |
| | | | | 211/41.18 |
| 7,823,991 B2 * | 11/2010 | Purdy | ................ | E05B 65/462 |
| | | | | 312/902 |
| 7,876,575 B2 * | 1/2011 | Hosokawa | ........ | H01L 21/67383 |
| | | | | 206/706 |
| 8,528,750 B2 * | 9/2013 | Heo | ................ | H01L 21/67309 |
| | | | | 211/41.18 |
| 8,905,239 B2 * | 12/2014 | Kim | ................ | H01L 21/6735 |
| | | | | 211/41.18 |
| 11,211,276 B2 * | 12/2021 | Soejima | .............. | H01L 21/6732 |
| 2014/0231370 A1 * | 8/2014 | Han | ................ | H01L 21/67383 |
| | | | | 211/41.1 |

\* cited by examiner

SEMICONDUCTOR MANUFACTURING DEVICE TO SECURELY HOLD SEMICONDUCTOR PANELS FOR TRANSPORT AND MANUFACTURING PROCESSES

FIELD OF THE INVENTION

The present invention relates in general to semiconductor manufacturing and, more particularly, to a semiconductor manufacturing device and method of securely holding semiconductor panels for transport and manufacturing processes.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, digital signal processor (DSP), application specific integrated circuits (ASIC), memory, or other signal processing circuit.

A conventional semiconductor wafer typically contains a plurality of semiconductor die separated by a saw street. Active and passive circuits are formed in a surface of each semiconductor die. An interconnect structure can be formed over the surface of the semiconductor die. The semiconductor wafer is singulated into individual semiconductor die for use in a variety of electronic products. The individual semiconductor die are typically sealed within a package for electrical interconnect, structural support, and environmental protection. The singulated semiconductor die from the wafer are placed on a carrier, also referred to as a substrate strip panel or reconstituted wafer. The strip panel is covered by an encapsulant.

The packaging process sometimes involves application of heat, such as during curing, baking, and molding. FIG. 1a shows strip panel 50 placed in magazine 52 and resting on shelf extensions 54. Strip panel 50 remains in place solely by nature of gravity and static friction, as shown in FIG. 1b. Substrate strip panel 50 has the potential to dislocate from their resting locations if magazine 52 is dropped or subject to other unintended movement. Hence, strip panel 50 is subject to damage during transport of magazine 52. In FIG. 1c, magazine 52 is placed in oven 56 for one or more thermal cycles from heat source 58. The application of heat to strip panel 50 resting on shelf extensions 54 can cause the wafer to move and/or warp. A warped strip panel can damage the semiconductor die and reduce wafer yield.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
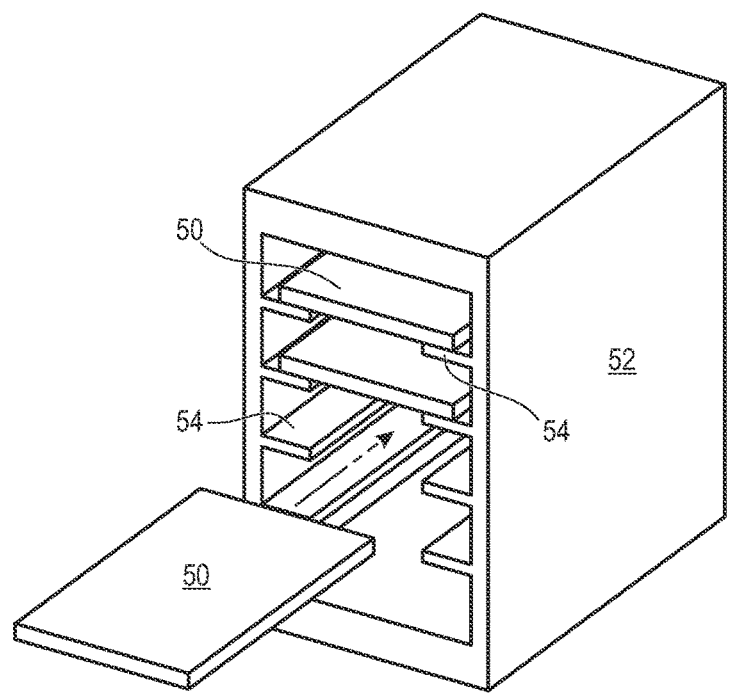
FIGS. 1a-1c illustrate a conventional strip panel placed in a magazine and oven.
Figure 1B:
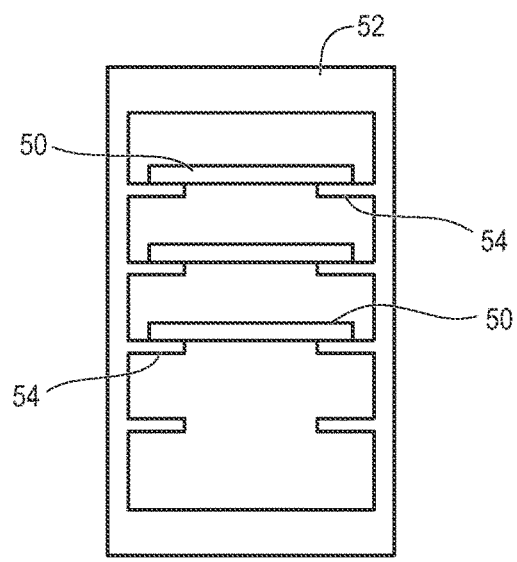
Figure 1C:
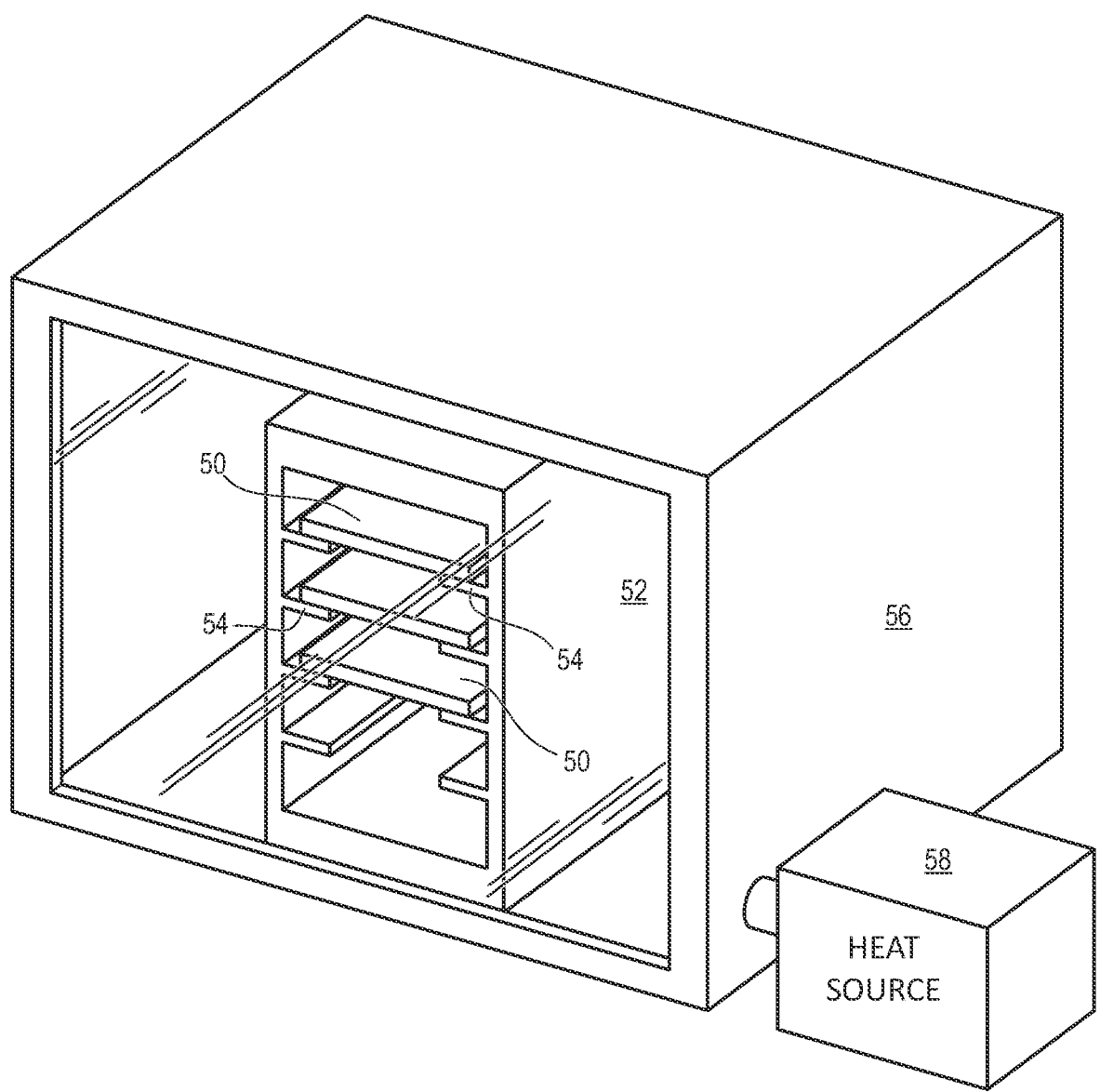
Figure 2A:
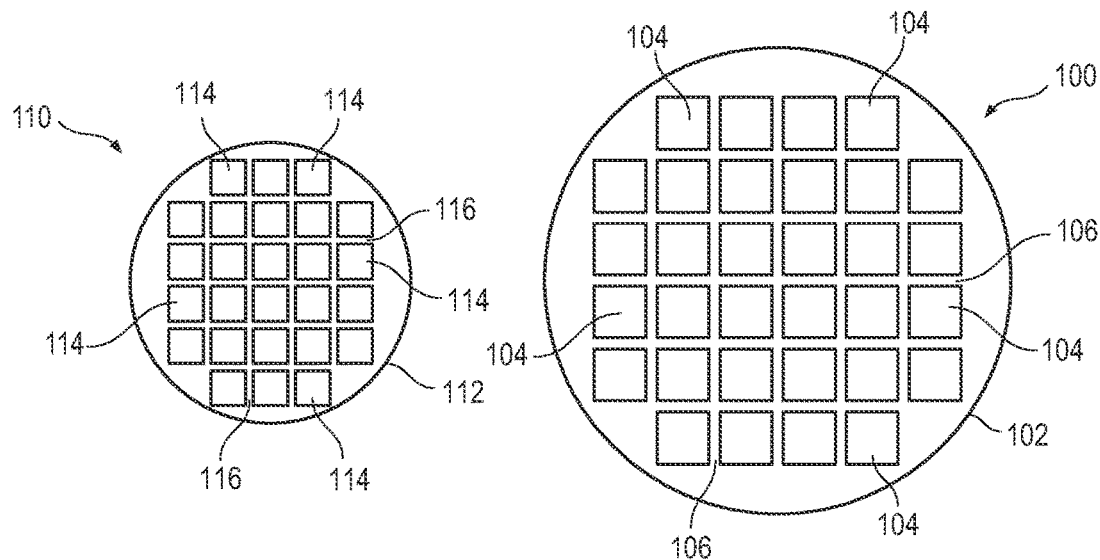
FIGS. 2a-2c illustrate semiconductor wafers each with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Semiconductor wafer 100 may have any diameter prior to singulating semiconductor wafer into individual semiconductor die 104. In one embodiment, semiconductor wafer 100 is 200-300 mm in diameter. In another embodiment, semiconductor wafer 100 is 100-450 mm in diameter. Semiconductor die 104 may have any size, and in one embodiment, semiconductor die 104 have dimensions of 10 mm by 10 mm.

FIG. 2a also shows semiconductor wafer 110, which is similar to semiconductor wafer 100. Semiconductor wafer 110 includes a base substrate material 112, such as silicon, germanium, gallium arsenide, indium phosphide, or silicon carbide, for structural support. A plurality of semiconductor die or components 114 is formed on wafer 110 separated by a non-active, inter-die wafer area or saw street 116 as described above. Saw street 116 provides cutting areas to singulate semiconductor wafer 110 into individual semiconductor die 114. Semiconductor wafer 110 may have the same diameter or a different diameter from semiconductor wafer 100. Semiconductor wafer 110 may have any diameter prior to singulating semiconductor wafer into individual semiconductor die 114. In one embodiment, semiconductor wafer 110 is 200-300 mm in diameter. In another embodiment, semiconductor wafer 110 is 100-450 mm in diameter. Semiconductor die 114 may have any size, and in one embodiment, semiconductor die 114 are smaller than semiconductor die 104 and have dimensions of 5 mm by 5 mm.

Figure 2B:
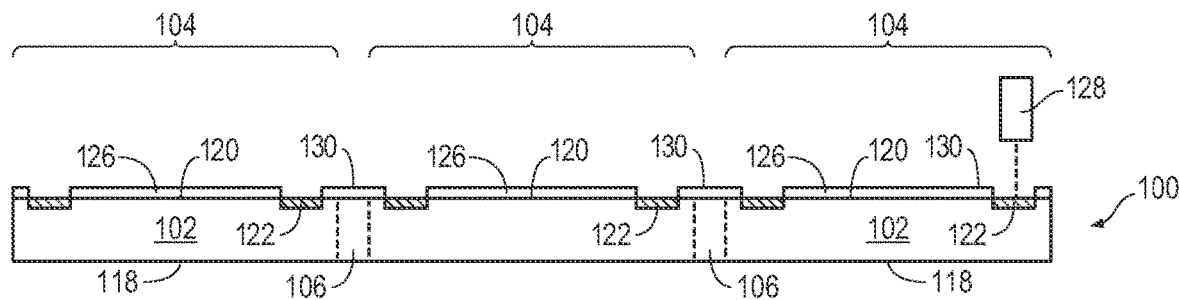

FIG. 2b shows a cross-sectional view of a portion of semiconductor wafer 100. Each semiconductor die 104 has a back or non-active surface 118 and an active surface 120 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 120 to implement analog circuits or digital circuits, such as DSP, ASIC, memory, or other signal processing circuit. Semiconductor die 104 may also contain IPDs, such as inductors, capacitors, and resistors, for RF signal processing.

An electrically conductive layer 122 is formed over active surface 120 using PVD, CVD, electrolytic plating, electroless plating process, or other suitable metal deposition process. Conductive layer 122 can be one or more layers of aluminum (Al), copper (Cu), tin (Sn), nickel (Ni), gold (Au), silver (Ag), or other suitable electrically conductive material. Conductive layer 122 operates as contact pads electrically connected to the circuits on active surface 120.

A first insulating or passivation layer 126 is formed over semiconductor die 104 and conductive layer 122 using PVD, CVD, printing, spin coating, spray coating, sintering or thermal oxidation. Insulating layer 126 can made be of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 126 provides isolation and protection for active surface 120 and conductive layer 122. In one embodiment, insulating 126 is a low temperature curing photosensitive dielectric polymer with or without insulating fillers cured at less than 200° C. A portion of insulating layer 126 is removed by laser direct ablation (LDA) using laser 128 or an etching process through a patterned photoresist layer to expose conductive layer 122 through surface 130 of insulating layer 126 and provides for subsequent electrical interconnect.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, or metallurgical microscope. Semiconductor wafer 100 is inspected for structural characteristics including warpage, thickness variation, surface particulates, irregularities, cracks, delamination, and discoloration.

The active and passive components within semiconductor die 104 undergo testing at the wafer-level for electrical performance and circuit function. Each semiconductor die 104 is tested for functionality and electrical parameters using a probe or other testing device. A probe is used to make electrical contact with nodes or contact pads 122 on each semiconductor die 104 and provides electrical stimuli to the contact pads. Semiconductor die 104 respond to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as KGD for use in a semiconductor package.

Figure 2C:
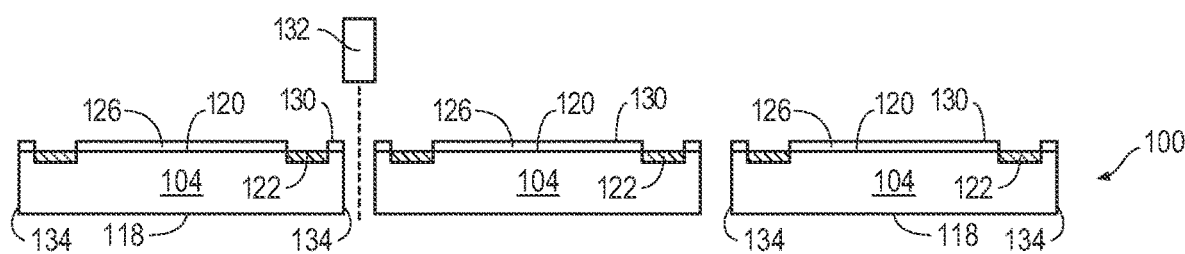

In FIG. 2c, semiconductor wafer 100 is singulated through saw streets 106 using a saw blade or laser cutting tool 132 into individual semiconductor die 104 having edges, sidewalls, or side surfaces 134.

Semiconductor wafer 110 from FIG. 2a undergoes the same processing and testing as described above for semiconductor wafer 100. Semiconductor wafer 110 is singulated through saw streets 116 using a saw blade or laser cutting tool 132 into individual semiconductor die 114. Individual semiconductor die 114 can be inspected and electrically tested for identification of KGD post singulation.

Figure 3A:
FIGS. 3a-3f illustrate a process of forming strip panels or reconstituted wafers from the semiconductor die.

FIGS. 3a-3f illustrate a process of forming a strip panel or reconstituted or embedded fan-in wafer level chip scale package (WLCSP). FIG. 3a shows a cross-sectional view of a portion of a carrier or temporary substrate 140 containing sacrificial base material such as silicon, polymer, beryllium oxide, glass, or other suitable low-cost, rigid material for structural support. An interface layer or double-sided tape 142 is formed over carrier 140 as a temporary adhesive bonding film, etch-stop layer, or thermal release layer.

Carrier 140 is a standardized carrier with capacity for multiple semiconductor die and can accommodate semiconductor die of multiple sizes singulated from semiconductor wafers having any diameter. For example, carrier 140 can be a round panel with a diameter of 305 mm or greater or can be a rectangular panel with a length of 300 mm or greater and a width of 300 mm or greater. Carrier 140 may have a larger surface area than the surface area of semiconductor wafer 100 or 110. In one embodiment, semiconductor wafer 100 has a diameter of 300 mm and contains semiconductor die 104 which have a length of 10 mm and a width of 10 mm. In one embodiment, semiconductor wafer 110 has a diameter of 200 mm and contains semiconductor 114 which have a length of 5 mm and a width of 5 mm. Carrier 140 can accommodate both 10 mm by 10 mm semiconductor die 104 and 5 mm by 5 mm semiconductor die 114. Carrier 140 carries a greater quantity of 5 mm by 5 mm semiconductor die 114 than a quantity of 10 mm by 10 mm semiconductor die 104. In another embodiment, semiconductor die 104 and 114 have the same dimensions. Carrier 140 is standardized in size and shape to accommodate any size semiconductor die. A larger carrier reduces the manufacturing cost of the semiconductor package as more semiconductor die can be processed on the larger carrier thereby reducing the cost per unit.

Semiconductor packaging and processing equipment are designed and configured for the size of the semiconductor die and carrier being processed. To further reduce manufacturing costs, the size of carrier 140 is selected independent of the size of semiconductor die 104 or 114 and independent of the size of semiconductor wafers 100 and 110. That is, carrier 140 has a fixed or standardized size, which can accommodate various sizes of semiconductor die 104 and 114 singulated from one or more semiconductor wafers 100 or 110. In one embodiment, carrier 140 is circular or round with a diameter of 140 mm. In another embodiment, carrier 140 is rectangular with a width of 560 mm and length of 600 mm.

The size and dimensions of the standardized carrier, carrier 140, is selected during the design of the processing equipment in order to develop a manufacturing line that is uniform for all back-end semiconductor manufacturing of semiconductor devices. Carrier 140 remains constant in size regardless of the size and type of semiconductor packages to be manufactured. For example, semiconductor die 104 may have dimensions of 10 mm by 10 mm and are placed on standardized carrier 140. Alternatively, semiconductor die 104 may have dimensions of 20 mm by 20 mm and are placed on the same standardized carrier 140. Accordingly, standardized carrier 140 can handle any size semiconductor die 104 and 114, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 140 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Figure 3B:
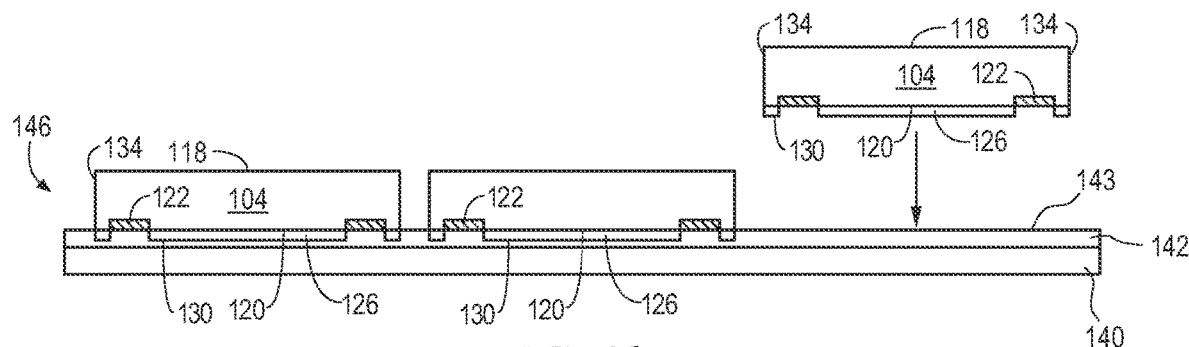

In FIG. 3b, semiconductor die 104 from FIG. 2c are mounted to carrier 140 and interface layer 142 using, for example, a pick and place operation with insulating layer 126 oriented toward carrier 140. Semiconductor die 104 are mounted to interface layer 142 of carrier 140 to form reconstituted or reconfigured wafer 146. In one embodiment, insulating layer 126 is embedded within interface layer 142. For example, active surface 120 of semiconductor die 104 may be coplanar with surface 143 of interface layer 142. In another embodiment, insulating layer 126 is mounted over interface layer 142 such that active surface 120 of semiconductor die 104 is offset from interface layer 142.

Reconstituted wafer or reconstituted panel 146 can be processed into many types of semiconductor packages, including fan-in WLCSP, reconstituted or eWLCSP, fan-out WLCSP, flipchip packages, 3D packages, such as PoP, or other semiconductor packages. Reconstituted panel 146 is configured according to the specifications of the resulting semiconductor package. In one embodiment, semiconductor die 104 are placed on carrier 140 in a high-density arrangement, i.e., 300 µm apart or less, for processing fan-in devices. Semiconductor die 104 are placed onto carrier 140 separated by a gap or distance D between semiconductor die 104. Distance D between semiconductor die 104 is selected based on the design and specifications of the semiconductor package to be processed. In one embodiment, distance D between semiconductor die 104 is 50 µm or less. In another embodiment, distance D between semiconductor die 104 is 100 µm or less. Distance D between semiconductor die 104 on carrier 140 is optimized for manufacturing the semiconductor packages at the lowest unit cost.

Figure 3C:
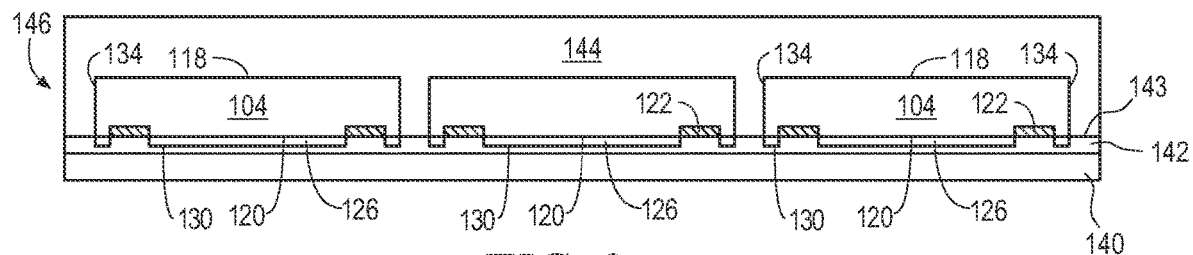

In FIG. 3c, an encapsulant or molding compound 144 is deposited over semiconductor die 104 and carrier 140 using a paste printing, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants. In another embodiment, encapsulant 144 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 144 is a low temperature curing photosensitive dielectric polymer with or without insulating fillers cured at less than 200° C.

In particular, encapsulant 144 is disposed alongside surfaces 134 of semiconductor die 104 and thus covers each side surface 134 of semiconductor die 104. Accordingly, encapsulant 144 covers or contacts at least four surfaces of semiconductor die 104, i.e., four side surfaces 134 of semiconductor die 104. Encapsulant 144 also covers back surface 118 of semiconductor die 104. Encapsulant 144 protects semiconductor die 104 from degradation due to exposure to photons from light or other emissions. In one embodiment, encapsulant 144 is opaque and dark or black in color. FIG. 3c shows composite substrate or reconstituted panel 146 covered by encapsulant 144. Encapsulant 144 can be used for laser marking reconstituted panel 146 for alignment and singulation. Encapsulant 144 is formed over back surface 118 of semiconductor die 104, and can be thinned in a subsequent backgrinding step. Encapsulant 144 can also be deposited such that the encapsulant is coplanar with back surface 118 and does not cover the back surface.

Figure 3D:
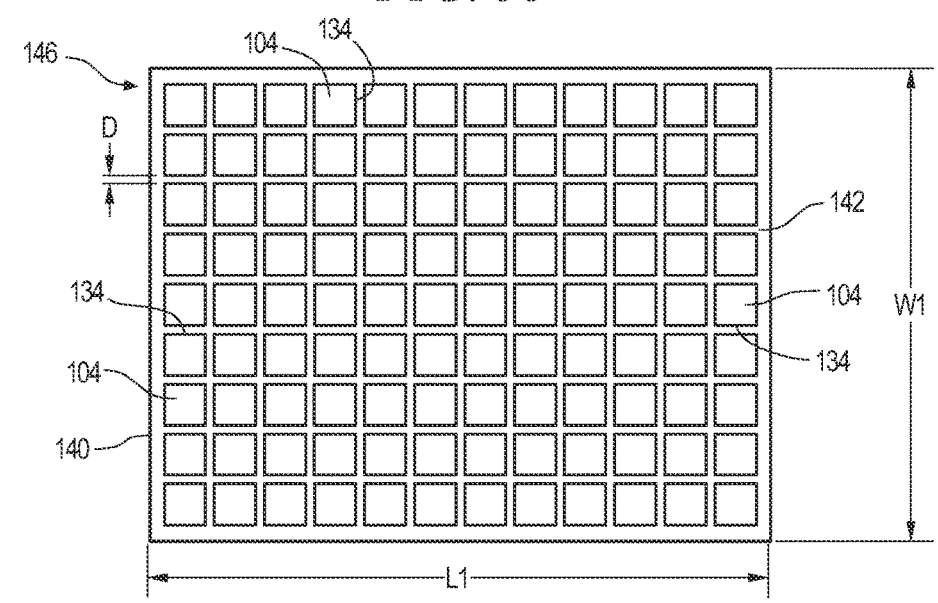

FIG. 3d shows a plan view of reconstituted panel 146 with semiconductor die 104 mounted to or disposed over carrier 140. Carrier 140 is a standardized shape and size, and therefore constitutes a standardized carrier. Carrier 140 has capacity for various sizes and quantities of semiconductor die, which are singulated from various sizes of semiconductor wafers. In one embodiment, carrier 140 is rectangular in shape and has a width W1 of 560 mm and a length L1 of 600 mm. In another embodiment, carrier 140 is rectangular in shape and has a width W1 of 140 mm and a length L1 of 140 mm. In another embodiment, carrier 140 is round in shape and has a diameter of 140 mm.

The number of semiconductor die 104 disposed over carrier 140 depends on the size of semiconductor die 104 and distance D between semiconductor die 104 within the structure of reconstituted panel 146. The number of semiconductor die 104 mounted to carrier 140 can be greater than, less than, or equal to the number of semiconductor die 104 singulated from semiconductor wafer 100. The larger surface area of carrier 140 accommodates more semiconductor die 104 and lowers manufacturing cost as more semiconductor die 104 are processed per reconstituted panel 146. In one example, semiconductor wafer 100 has a diameter of 300 mm with a quantity of approximately 600 individual 10 mm by 10 mm semiconductor die 104 formed on semiconductor wafer 100. Semiconductor die 104 are singulated from one or more semiconductor wafers 100. Carrier 140 is prepared, for example, with a standard width W1 of 560 mm and a standard length L1 of 600 mm. Carrier 140 with a width W1 of 560 mm is sized to accommodate a quantity of approximately 54 semiconductor die 104, with dimensions of 10 mm by 10 mm and spaced a distance D of 200 µm apart, across width W1 of carrier 140. Carrier 140 with a length L1 of 600 mm is sized to accommodate a quantity of approximately 58 semiconductor die 104, with dimensions of 10 mm by 10 mm spaced a distance D of 200 µm apart, across length L1 of carrier 140. Accordingly, the surface area of carrier 140, width W1 multiplied by length L1, accommodates a quantity of approximately 3,000 semiconductor die 104 with dimensions of 10 mm by 10 mm and a gap or distance D of 200 µm between semiconductor die 104. Semiconductor die 104 can be placed on carrier 140 with a gap or distance D of less than 200 µm between semiconductor die 104 to increase the density of semiconductor die 104 on carrier 140 and further reduce the cost of processing semiconductor die 104.

Automated pick and place equipment is used to prepare reconstituted panel 146 based on the quantity and size of semiconductor die 104 and based on the dimensions of carrier 140. For example, semiconductor die 104 is selected with dimensions of 10 mm by 10 mm. Carrier 140 has standard dimensions, for example, 560 mm width W1 and 600 mm length L1. Automated equipment is programmed with the dimensions of semiconductor die 104 and carrier 140 in order to process reconstituted panel 146. After singulating semiconductor wafer 100, a first semiconductor die 104 is selected by the automated pick and place equipment. A first semiconductor die 104 is mounted to carrier 140 in a position on carrier 140 determined by the programmable automated pick and place equipment. A second semiconductor die 104 is selected by the automated pick and place equipment, and placed on carrier 140 and positioned in a first row on carrier 140. Distance D between adjacent semiconductor die 104 is programmed into the automated pick and place equipment and is selected based on the design and specifications of the semiconductor package to be processed. In one embodiment, the gap or distance D between adjacent semiconductor die 104 on carrier 140 is 200 µm. A third semiconductor die 104 is selected by the automated pick and place equipment, and placed on carrier 140 and positioned in the first row on carrier 140 a distance D of 200 µm from an adjacent semiconductor die 104. The pick and place operation is repeated until a first row of approximately 54 semiconductor die 104 is disposed across width W1 of carrier 140.

Another semiconductor die 104 is selected by the automated pick and place equipment, and placed on carrier 140 and positioned in a second row adjacent to the first row on carrier 140. Distance D between adjacent rows of semiconductor die 104 is preselected and programmed into the automated pick and place equipment. In one embodiment, the distance D between a first row of semiconductor die 104 and a second row of semiconductor die 104 is 200 µm. The pick and place operation is repeated until approximately 58 rows of semiconductor die 104 are disposed across length L1 of carrier 140. The standardized carrier, carrier 140 with width W1 of 560 mm and length L1 of 600 mm, accommodates approximately 54 columns and 58 rows of 10 mm by 10 mm semiconductor die 104 for a total quantity of approximately 3,000 semiconductor die 104 disposed on carrier 140. The pick and place operation is repeated until carrier 140 is partially or completely populated with semiconductor die 104. With a standardized carrier, such as carrier 140, the automated pick and place equipment can mount any size semiconductor die 104 on carrier 140 to form reconstituted panel 146. Reconstituted panel 146 can subsequently be processed using back-end processing equipment that is standardized for standardized carrier 140.

Figure 3E:
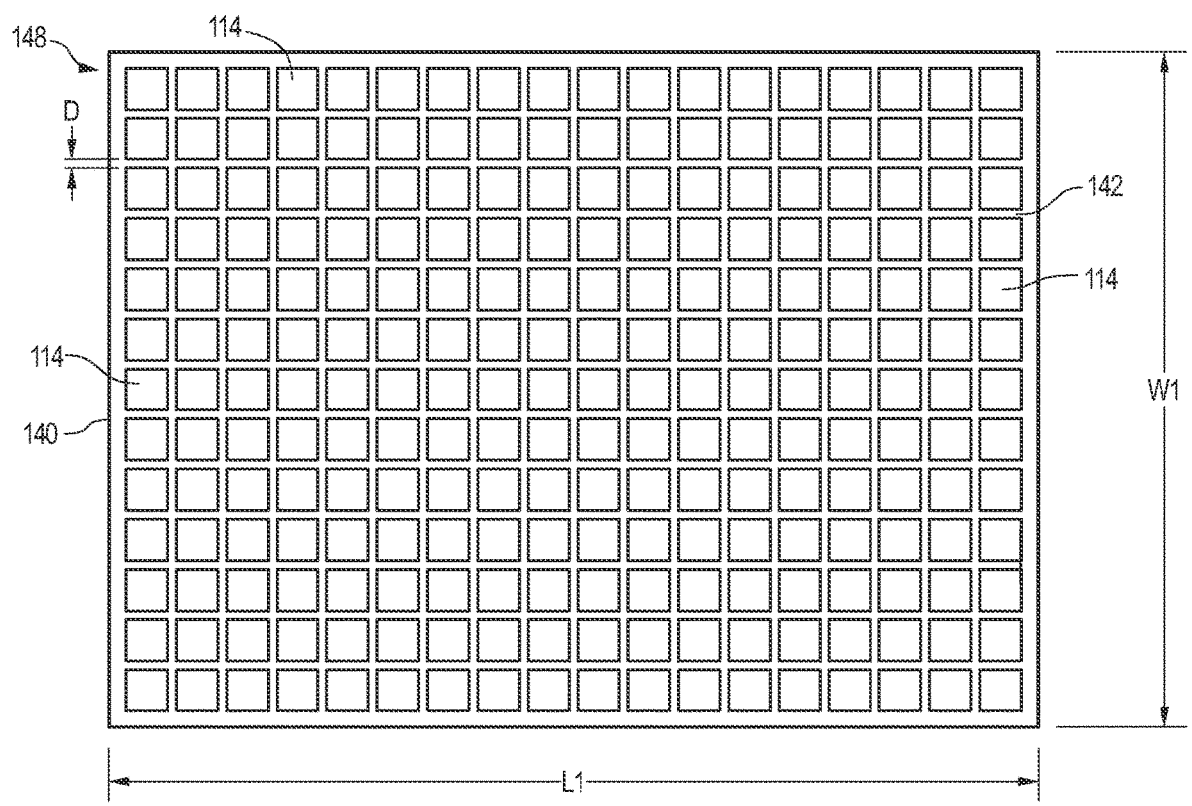

FIG. 3e shows a plan view of reconstituted wafer or reconstituted panel 148 with semiconductor die 114 mounted to or disposed over carrier 140. The same standardized carrier 140, or a standardized carrier with the same size as carrier 140, is used to process reconstituted panel 148 as was used to process reconstituted panel 146. Any configuration of semiconductor die on a reconstituted wafer or panel can be supported by carrier 140. The number of semiconductor die 114 disposed over carrier 140 depends on the size of semiconductor die 114 and distance D1 between semiconductor die 114 within the structure of reconstituted panel 148. The number of semiconductor die 114 mounted to carrier 140 can be greater than, less than, or equal to the number of semiconductor die 114 singulated from semiconductor wafer 110. The larger surface area of carrier 140 accommodates more semiconductor die 114 and lowers manufacturing cost as more semiconductor die 114 are processed per reconstituted panel 148.

In one example, semiconductor wafer 110 has a diameter of 200 mm with a quantity of approximately 1,000 individual 5 mm by 5 mm semiconductor die 114 formed on semiconductor wafer 110. Semiconductor die 114 are singulated from one or more semiconductor wafers 110. Carrier 140 is prepared, for example, with a standard width W1 of 560 mm and a standard length L1 of 600 mm. Carrier 140 with a width W1 of 560 mm is sized to accommodate a quantity of approximately 107 semiconductor die 114, with dimensions of 5 mm by 5 mm spaced a distance D1 of 200 µm apart, across width W1 of carrier 140. Carrier 140 with a length L1 of 600 mm is sized to accommodate a quantity of approximately 115 semiconductor die 114, with dimensions of 5 mm by 5 mm spaced a distance D1 of 200 µm apart, across length L1 of carrier 140. Accordingly, the surface area of carrier 140, width W1 multiplied by length L1, accommodates approximately 12,000 semiconductor die 114 with dimensions of 5 mm by 5 mm spaced a distance D1 of 200 µm apart. Semiconductor die 114 can be placed on carrier 140 with a gap or distance D1 of less than 200 µm between semiconductor die 114 to increase the density of semiconductor die 114 on carrier 140 and further reduce the cost of processing semiconductor die 114.

Automated pick and place equipment is used to prepare reconstituted panel 148 based on the quantity and size of semiconductor die 114 and based on the dimensions of carrier 140. For example, semiconductor die 114 is selected with dimensions of 5 mm by 5 mm. Carrier 140 has standard dimensions, for example, 560 mm width W1 and 600 mm length L1. Automated equipment is programmed with the dimensions of semiconductor die 114 and carrier 140 in order to process reconstituted panel 148. After singulating semiconductor wafer 110, a first semiconductor die 114 is selected by the automated pick and place equipment. A first semiconductor die 114 is mounted to carrier 140 in a position on carrier 140 determined by the programmable automated pick and place equipment. A second semiconductor die 114 is selected by the automated pick and place equipment, and placed on carrier 140 and positioned in a first row on carrier 140 a distance D1 from the first semiconductor die 114. Distance D1 between adjacent semiconductor die 114 is programmed into the automated pick and place equipment and is selected based on the design and specifications of the semiconductor package to be processed. In one embodiment, the gap or distance D1 between adjacent semiconductor die 114 on carrier 140 is 200 µm. A third semiconductor die 114 is selected by the automated pick and place equipment, and placed on carrier 140 and positioned in the first row on carrier 140. The pick and place operation is repeated until a row of approximately 107 semiconductor die 114 is disposed across width W1 of carrier 140.

Another semiconductor die 114 is selected by the automated pick and place equipment, placed on carrier 140, and positioned in a second row adjacent to the first row on carrier 140. Distance D1 between adjacent rows of semiconductor die 114 is preselected and programmed into the automated pick and place equipment. In one embodiment, distance D1 between a first row of semiconductor die 114 and a second row of semiconductor die 114 is 200 µm. The pick and place operation is repeated until approximately 115 rows of semiconductor die 114 are disposed across length L1 of carrier 140. The standardized carrier, carrier 140 with width W1 of 560 mm and length L1 of 600 mm, accommodates approximately 107 columns and 115 rows of 5 mm by 5 mm semiconductor die 114 for a total quantity of approximately 12,000 semiconductor die 114 disposed on carrier 140. The pick and place operation is repeated until carrier 140 is partially or completely populated with semiconductor die 114. With a standardized carrier, such as carrier 140, the automated pick and place equipment can mount any size semiconductor die on carrier 140 to form reconstituted panel 148. Reconstituted panel 148 can be processed using the same carrier 140 and same back-end processing equipment as was used to process reconstituted panel 146.

Both reconstituted panel 146 from FIG. 3d and reconstituted panel 148 from FIG. 3e use the same carrier 140 or use a carrier having the same standardized size for both reconstituted panels 146 and 148. The processing equipment designed for back-end processing of the reconstituted wafers or panels is standardized for carrier 140 and is capable of processing any configuration of reconstituted wafer or panel formed on carrier 140 and any size semiconductor die placed on carrier 140. Because both reconstituted panels 146 and 148 use the same standardized carrier 140, the reconstituted panels can be processed on the same manufacturing line. Accordingly, a purpose of standardized carrier 140 is to simplify the equipment needed to manufacture semiconductor packages.

In another example, reconstituted panel 148 includes semiconductor die 104 and 114 where each semiconductor die 104 and 114 has the same dimensions, and the semiconductor die originate from semiconductor wafers 100 and 110 which have different diameters. Semiconductor wafer 100 has a diameter of 450 mm with a quantity of approximately 2,200 individual 8 mm by 8 mm semiconductor die 104 formed on semiconductor wafer 100. Semiconductor die 104 having dimensions of 8 mm by 8 mm are singulated from one or more semiconductor wafers 100. Additionally, semiconductor wafer 110 has a diameter of 300 mm with a quantity of approximately 900 individual 8 mm by 8 mm semiconductor die 114 formed on semiconductor wafer 110. Semiconductor die 114 having dimensions of 8 mm by 8 mm are singulated from one or more semiconductor wafers 110. Carrier 140 is prepared, for example, with a standard width W1 of 560 mm and a standard length L1 of 600 mm. Carrier 140 with a width W1 of 560 mm is sized to accommodate a quantity of approximately 69 semiconductor die 104 or 114, with dimensions of 8 mm by 8 mm spaced a distance D or D1 of 100 µm apart, across width W1 of carrier 140. Carrier 140 with a length L1 of 560 mm is sized to accommodate a quantity of approximately 74 semiconductor die 104 or 114, with dimensions of 8 mm by 8 mm spaced a distance D or D1 of 100 µm apart, across length L1 of carrier 140. The surface area of carrier 140, width W1 multiplied by length L1, accommodates approximately 5,000 semiconductor die 104 or 114 with dimensions of 8 mm by 8 mm spaced a distance D or D1 of 100 µm apart. Semiconductor die 104 and 114 can be placed on carrier 140 with a gap or distance D or D1 of less than 100 µm between semiconductor die 104 or 114 to increase the density of semiconductor die 104 and 114 on carrier 140 and further reduce the cost of processing semiconductor die 104 and 114.

Automated pick and place equipment is used to prepare reconstituted panel 148 based on the quantity and size of semiconductor die 104 and 114 and based on the dimensions of carrier 140. After singulating semiconductor wafer 110, a first semiconductor die 104 or 114 is selected by the automated pick and place equipment. The 8 mm by 8 mm semiconductor die 104 or 114 can originate from either semiconductor wafer 100, having a 450 mm diameter, or from semiconductor wafer 110, having a 110 mm diameter. Alternatively, the 8 mm by 8 mm semiconductor die originate from another semiconductor wafer having a different diameter. A first semiconductor die 104 or 114 is mounted to carrier 140 in a position on carrier 140 determined by the programmed automated pick and place equipment. A second semiconductor die 104 or 114 is selected by the automated pick and place equipment, placed on carrier 140, positioned in a first row on carrier 140. Distance D or D1 between adjacent semiconductor die 104 or 114 is programmed into the automated pick and place equipment and is selected based on the design and specifications of the semiconductor package to be processed. In one embodiment, the gap or distance D or D1 between adjacent semiconductor die 104 or 114 on carrier 140 is 100 µm. The pick and place operation is repeated until a row of approximately 69 semiconductor die 104 or 114 is disposed across width W1 of carrier 140.

Another semiconductor die 104 or 114 is selected by the automated pick and place equipment, placed on carrier 140, and positioned in a second row adjacent to the first row on carrier 140. In one embodiment, distance D or D1 between a first row of semiconductor die 104 or 114 and a second row of semiconductor die 104 or 114 is 100 µm. The pick and place operation is repeated until approximately 74 rows of semiconductor die 104 or 114 are disposed across length L1 of carrier 140. The standardized carrier, carrier 140 with width W1 of 560 mm and length L1 of 600 mm, accommodates approximately 69 columns and 74 rows of 8 mm by 8 mm semiconductor die 104 and 114 for a total quantity of approximately 5,000 semiconductor die 104 disposed on carrier 140. The pick and place operation is repeated until carrier 140 is partially or completely populated with semiconductor die 104 or 114. Therefore, reconstituted panel 148 may include semiconductor die 104 and 114 singulated from any size semiconductor wafer. The size of carrier 140 is independent of the size of semiconductor die 104 and 114 and is independent of the size of semiconductor wafers 100 and 110. Reconstituted panel 148 can be processed using the same carrier 140 and same back-end processing equipment as was used to process reconstituted panel 146. For reconstituted wafers or panels having the same size semiconductor die singulated from different size incoming wafers, standardized carrier 140 allows the same materials to be used for each reconstituted wafer or panel. Therefore, the bill of materials for a reconstituted panel 146 or 148 on carrier 140 remains constant. A consistent and predictable bill of materials allows for improved cost analysis and planning for semiconductor packaging.

In another embodiment, a reconstituted panel 148 contains a variety of semiconductor die sizes disposed on carrier 140. For example, 10 mm by 10 mm semiconductor die 104 are mounted to carrier 140, and 5 mm by 5 mm semiconductor die 114 are mounted to carrier 140 to form reconstituted panel 148. The reconstituted panel contains multiple sizes of semiconductor die on the same reconstituted panel. In other words, a portion of reconstituted panel 148 contains one size semiconductor die and another portion of the reconstituted panel contains another size semiconductor die. Reconstituted panel 148 containing different sizes of semiconductor die 104 and 114 simultaneously on carrier 140 is processed using the same back-end processing equipment as was used to process another reconstituted panel 146 having uniformly sized semiconductor die disposed over carrier 140.

Carrier 140 has capacity for various sizes and quantities of semiconductor die, which are singulated from various sizes of semiconductor wafers. The size of carrier 140 does not vary with the size of semiconductor die being processed. The standardized carrier, carrier 140, is fixed in size and can accommodate multiple sizes of semiconductor die. The size of standardized carrier 140 is independent of the dimensions of the semiconductor die or semiconductor wafer. More small semiconductor die than larger semiconductor die can fit on carrier 140. The number of semiconductor die 104 or 114, which fit on carrier 140, varies with the size of semiconductor die 104 or 114 and space or distance D or D1 between semiconductor die 104 or 114. For example, carrier 140 having length L1 and width W1 accommodates a greater number of 5 mm by 5 mm semiconductor die 114 over the surface area of carrier 140 than a number of 10 mm by 10 mm semiconductor die 104 over the surface area of carrier 140. For example, carrier 140 holds approximately 3,000 10 mm by 10 mm semiconductor die or approximately 12,000 5 mm by 5 mm semiconductor die. The size and shape of carrier 140 remains fixed and independent of the size of semiconductor die 104 or 114 or semiconductor wafer 100 or 110 from which semiconductor die 104 or 114 are singulated. Carrier 140 provides the flexibility to manufacture reconstituted panels 146 and 148 into many different types of semiconductor packages with different size semiconductor die 104 and 114 from different sized semiconductor wafers 100 and 110 using a common set of processing equipment.

Figure 3F:
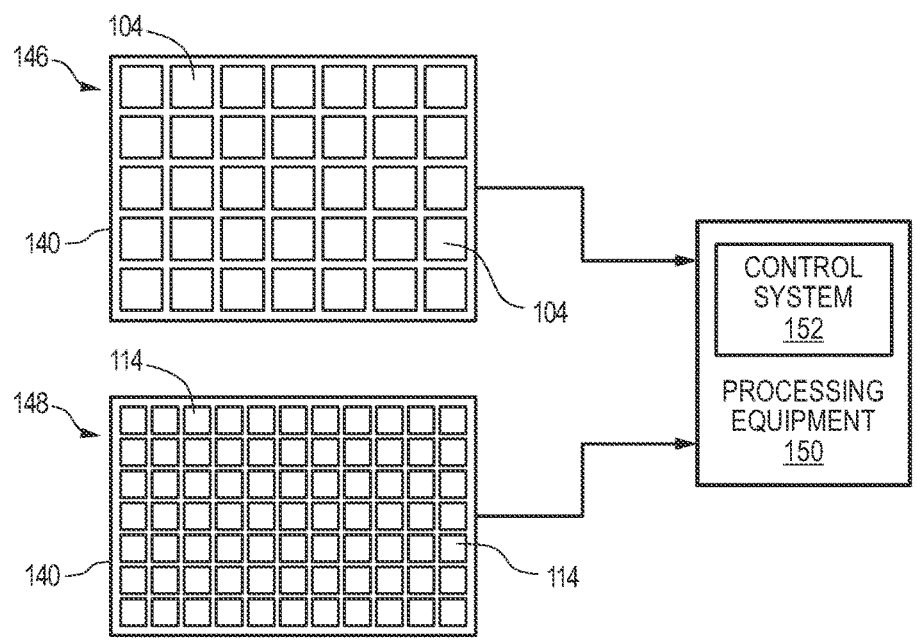

FIG. 3f shows a process of using carrier 140 to manufacture semiconductor packages. Processing equipment 150 is used to perform the back-end manufacturing processes on semiconductor die, such as deposition of encapsulant and insulating layers, deposition of conductive layers, bumping, reflowing, marking, singulation, curing, baking, and other back-end processes. Processing equipment 150 is designed for the size and shape of a standardized carrier, such as carrier 140. Processing equipment 150 is compatible with carrier 140, because the mechanical and electrical components of processing equipment 150 are customized for the standardized size and shape of carrier 140.

Processing equipment 150 is controlled by control system 152. Control system 152 can be a software program or algorithm used to configure processing equipment 150 according to the size and shape of the semiconductor die on carrier 140. Control system 152 is programmed and customized in order for processing equipment 150 to handle each different reconstituted wafer or panel, such as reconstituted panels 146 and 148, formed on standardized carrier 140.

By standardizing the dimensions of carrier 140, processing equipment 150 can remain constant, because the dimensions of carrier 140 do not change with variables of semiconductor die size and semiconductor wafer size. Control system 152 uses various algorithms for each reconstituted panel on carrier 140. For example, control system 152 can be used to optimize the spacing during the initial pick and place operation of semiconductor die 104 on carrier 140. The specifications of reconstituted panel 146 are inputted into control system 152. Control system 152 is programmed to control processing equipment 150 to pick individual semiconductor die 104 and place semiconductor die 104 onto carrier 140 a distance D apart to form reconstituted panel 146. Reconstituted panel 146 includes, for example, 10 mm by 10 mm semiconductor die 104 and standard dimensions of carrier 140, width W1 and length L1. Processing equipment 150 is configured with control system 152 to perform back-end processes on reconstituted panel 146, which is on carrier 140. Control system 152 directs processing equipment 150 to perform deposition and other manufacturing steps according to the 10 mm by 10 mm size of semiconductor die 104 and standard size carrier 140.

Control system 152 allows processing equipment 150 to be customized for each reconstituted wafer or panel on standardized carrier 140. Processing equipment 150 does not need to be re-built for a different size of semiconductor die. After processing reconstituted panel 146, processing equipment 150 is ready to process another reconstituted panel on carrier 140 with the same or different semiconductor die size and spacing. The specifications of reconstituted panel 148 are inputted into control system 152. Control system 152 is programmed to control processing equipment 150 to pick individual semiconductor die 114 and place semiconductor die 114 onto carrier 140 a distance D1 apart to form reconstituted panel 148. Reconstituted panel 148 includes, for example, 5 mm by 5 mm semiconductor die 114 and standard dimensions of carrier 140, width W1 and length L1. Processing equipment 150 is configured with control system 152 to perform back-end processes on reconstituted panel 148, which is on carrier 140. Control system 152 directs processing equipment 150 to perform deposition and other manufacturing steps according to the 5 mm by 5 mm size of semiconductor die 114 and standard size carrier 140.

Processing equipment 150 remains constant whether processing equipment 150 is processing reconstituted panel 146 or 148, or other reconstituted panel on standardized carrier 140. Control system 152 is programmable and processing equipment 150 is easily adaptable to any reconstituted wafer or panel which uses carrier 140. Therefore, the mechanical and physical characteristics of processing equipment 150 are designed to accommodate the physical characteristics of standardized carrier 140, while processing equipment 150 is also programmable with control system 152 to perform manufacturing processes on any configuration of semiconductor die on carrier 140.

Processing equipment 150 is used for manufacturing a variety of semiconductor packages from a reconstituted wafer or panel on carrier 140. For example, processing equipment 150 can be used to process reconstituted panel 146 or 148 into fan-in WLCSP, reconstituted or eWLCSP, fan-out WLCSP, flipchip packages, 3D packages, such as PoP, or other semiconductor packages. Control system 152 is used to modify and control the operation of processing equipment 150 to perform back-end manufacturing steps according to the semiconductor package to be produced. Therefore, processing equipment 150 can be used to manufacture each semiconductor package described herein. Processing equipment 150 can be used across multiple product manufacturing lines which share the same size carrier 140. Accordingly, the cost associated with changes in the size of semiconductor die, the size of semiconductor wafer, and type of semiconductor package can be reduced. The risk of investment in processing equipment 150 is reduced, because the design of processing equipment 150 is simplified where carrier 140 is standardized.

Figure 4A:
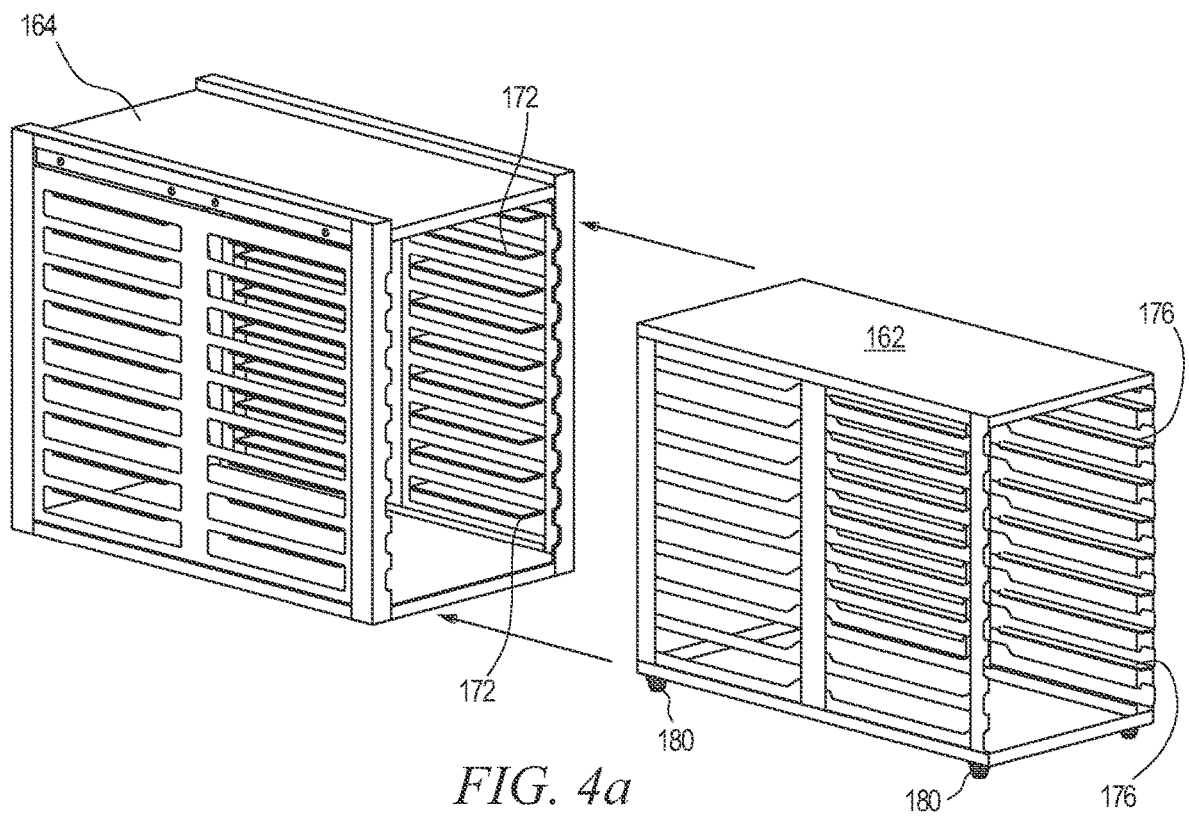
FIGS. 4a-4n illustrate a process of disposing the strip panels in a magazine for transport and manufacturing processing steps.
Figure 4B:
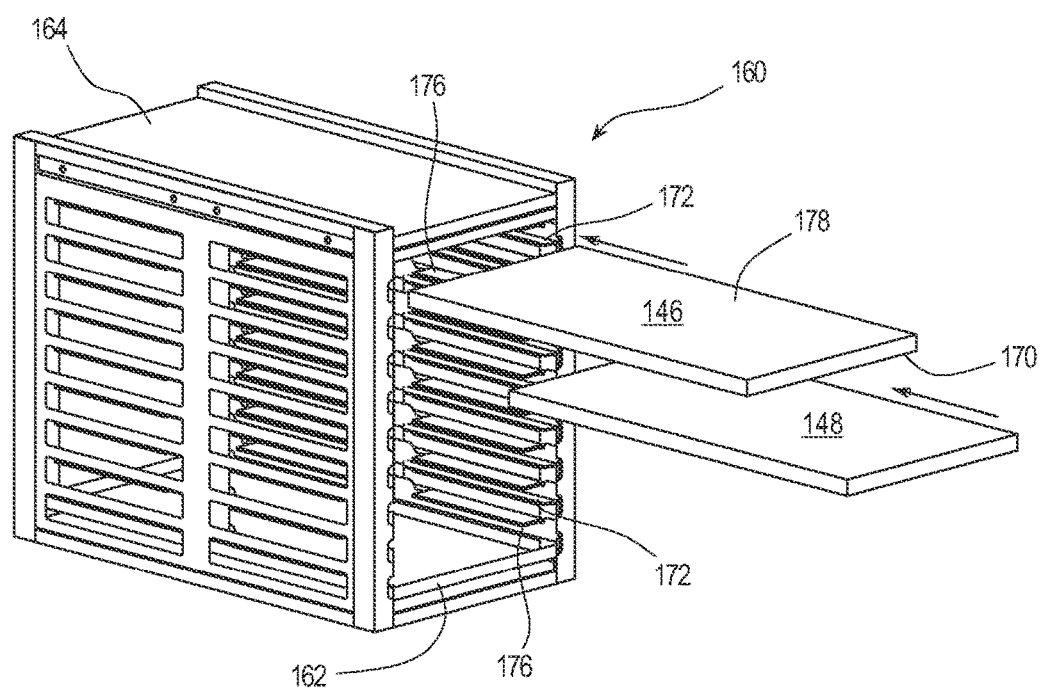

In one embodiment, processing equipment 150 involves the application of heat for curing, baking, or molding with respect to reconstituted panels 146-148. In this case, processing equipment 150 includes an oven or other heat source. In FIG. 4a, magazine panel holder 160 is provided to contain and hold in place reconstituted panels 146 and/or 148. Magazine panel holder 160 comprises two physical enclosures or cases: inner case 162 and outer case 164. In one embodiment, inner case 162 is inserted into outer case 164. The outer case 164 encloses inner case 162. FIG. 4b shows inner case 162 disposed within outer case 164 with reconstituted panels 146-148 poised for insertion. Inner case 162 is capable of vertical movement within outer case 164. Outer case 164 includes a plurality of case extensions 172 fixed in position relative to the outer case. Inner case 162 includes a plurality of case extensions 176. Upper case extension 176 moves in the vertical direction relative to lower case extension 172. In one embodiment, upper case extensions 176 are fixed in position relative to inner case housing 162 and the entire inner case housing and upper case extension move collectively in the vertical direction relative to lower case extensions 172.

Figure 4C:
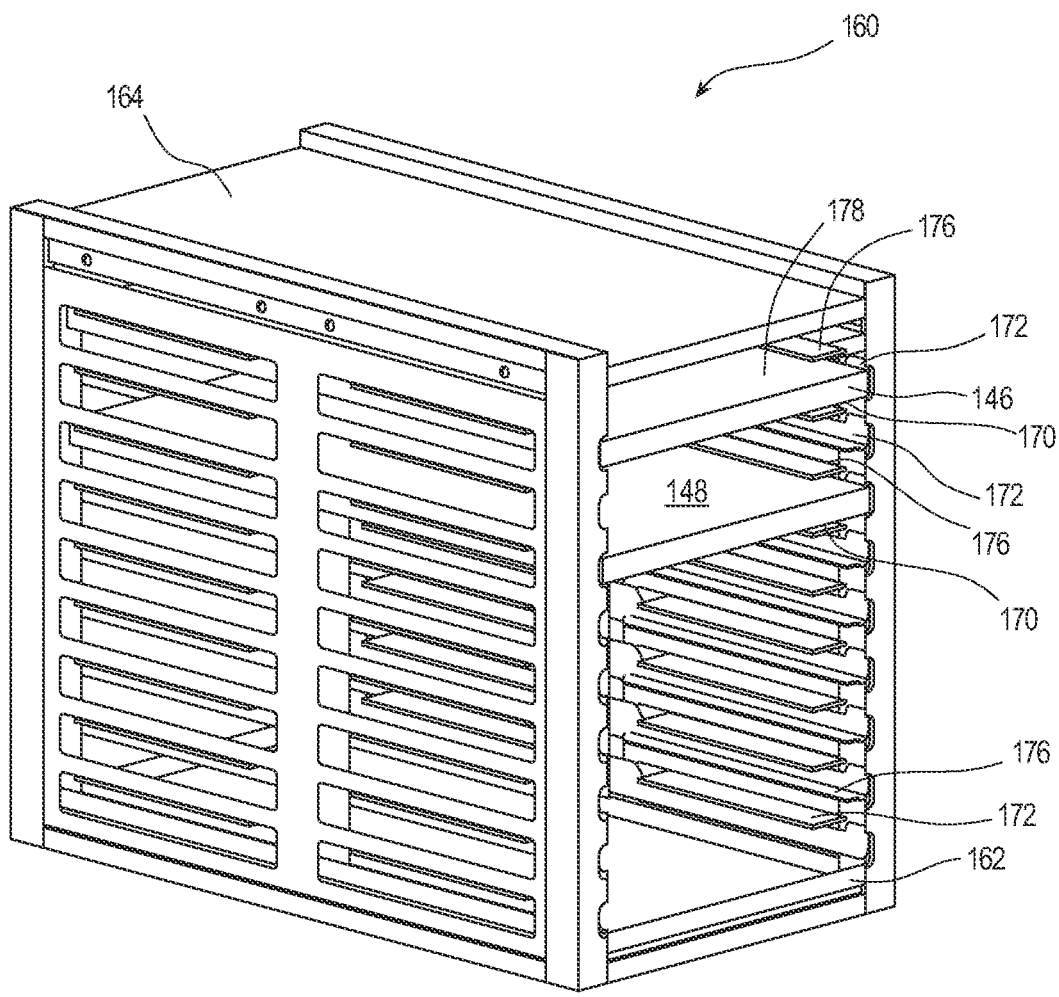

FIG. 4c shows reconstituted panels 146-148 disposed within magazine panel holder 160. Reconstituted panels 146 are each placed within magazine wafer holder 160 onto one case extension 172. Reconstituted panels 148 can also be placed in magazine 160 on one case extension 172. In particular, surface 170 of reconstituted panels 146 are disposed on or rest on lower case extension 172 of outer case housing 164. At this point, upper case extensions 176 of inner case housing 162 are positioned above and separated from surface 178 of reconstituted wafer 146.

Alternatively, semiconductor wafer 100 or 110 (unsingulated) can be directly placed in magazine panel holder 160 as a wafer level package (WLP). The semiconductor package can be formed at the wafer level with the size of each semiconductor die 104. Semiconductor die 104 can be flipchip, wire-bonded, or surface mount type semiconductor die.

Figure 5A:
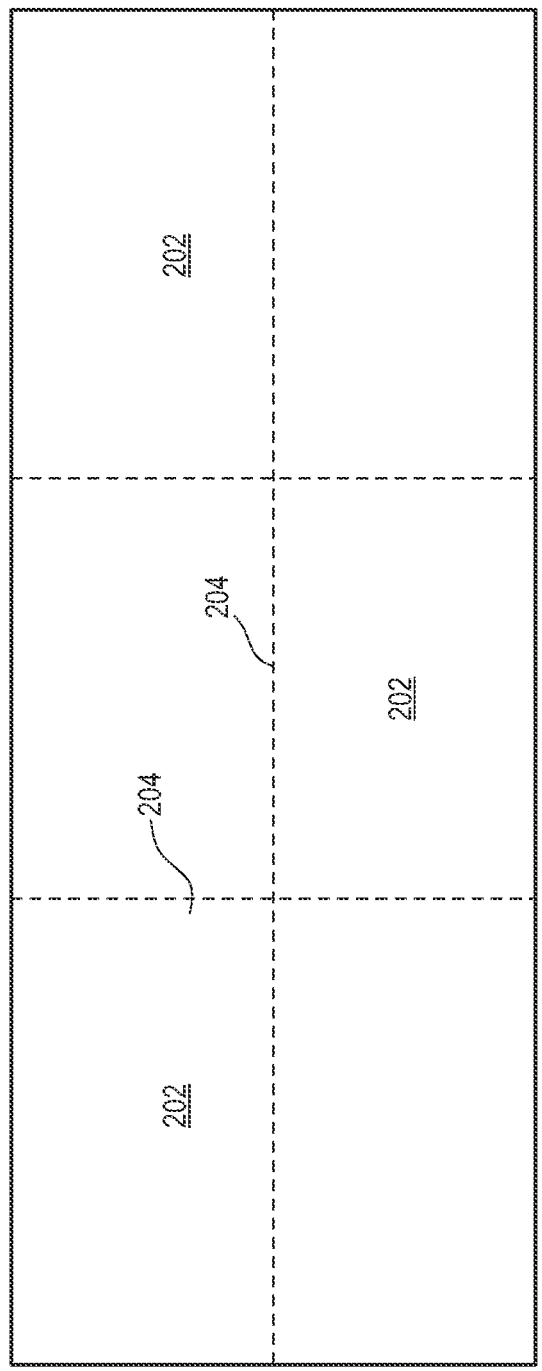
FIGS. 5a-5b illustrate a substrate strip with electronic components mounted to an interconnect substrate.
Figure 5B:
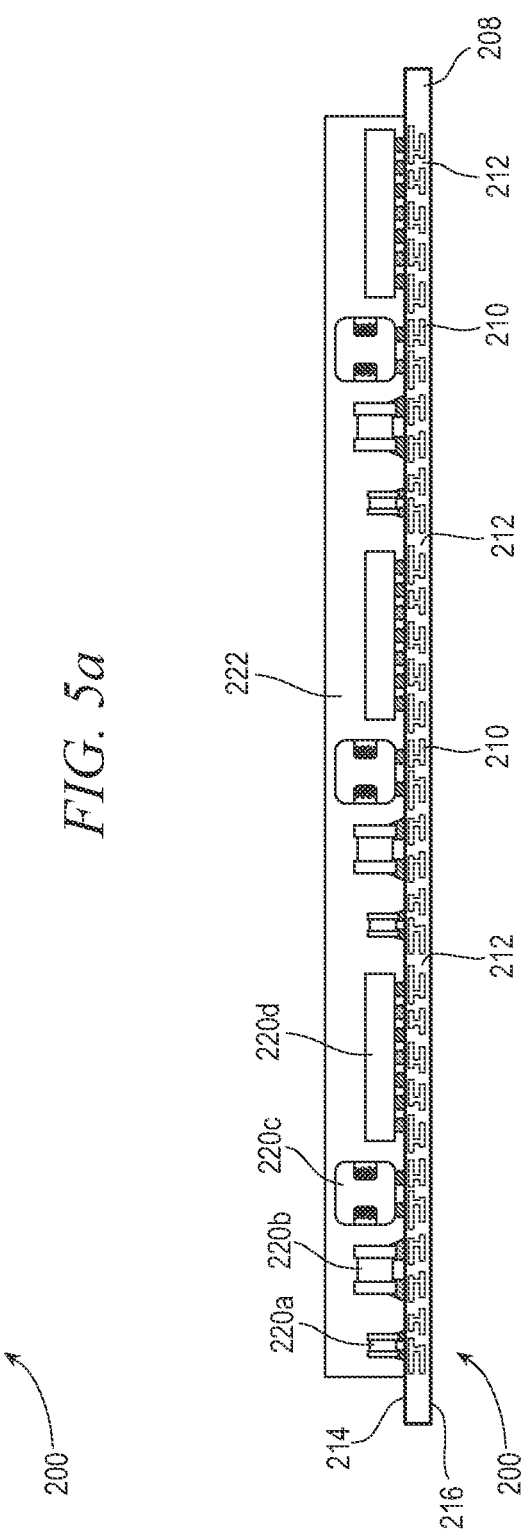

In yet another embodiment, FIG. 5a illustrates substrate strip panel 200 with capacity to accommodate a variety of electronic components in die attach areas 202, shown by dashed lines 204. In FIG. 5b, interconnect substrate 208 including conductive layers 210 and insulating layer 212. Conductive layer 210 can be one or more layers of Al, Cu, Sn, Ni, Au, Ag, or other suitable electrically conductive material. Conductive layer 210 provides horizontal electrical interconnect across substrate 208 and vertical electrical interconnect between top surface 214 and bottom surface 216 of substrate 208. Portions of conductive layer 210 can be electrically common or electrically isolated depending on the design and function of semiconductor die 104, 114, and other electrical components. Insulating layer 212 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layer 212 provides isolation between conductive layers 210.

A plurality of electrical components 220a-220d is mounted to surface 214 of interconnect substrate 208 and electrically and mechanically connected to conductive layers 210. Electrical components 220a-220d are each positioned over substrate 208 using a pick and place operation. For example, electrical components 220d can be semiconductor die 104 from FIG. 2c with active surface 110 oriented toward surface 214 of substrate 208 and electrically connected to conductive layer 210. Electrical components 220a-220d can include other semiconductor die, semiconductor packages, surface mount devices, discrete electrical devices, discrete transistors, diodes, or IPDs, such as a resistor, inductor, or capacitor.

An encapsulant or molding compound 222 is deposited over electric components 220a-220d and substrate 208 using a paste printing, compressive molding, transfer molding, liquid encapsulant molding, vacuum lamination, spin coating, or other suitable applicator. Encapsulant 222 can be polymer composite material, such as epoxy resin with filler, epoxy acrylate with filler, or polymer with proper filler. Encapsulant 222 is non-conductive, provides structural support, and environmentally protects the semiconductor device from external elements and contaminants. Substrate strip panel 200 can be placed with magazine panel holder 160. Magazine panel holder 160 can be a standardized size to accommodate a variety of semiconductor wafers 100 and 110 and substrate strip panels 200. Magazine panel holder 160 can also have other sizes to accommodate other semiconductor wafers and panels.

Figure 4D:
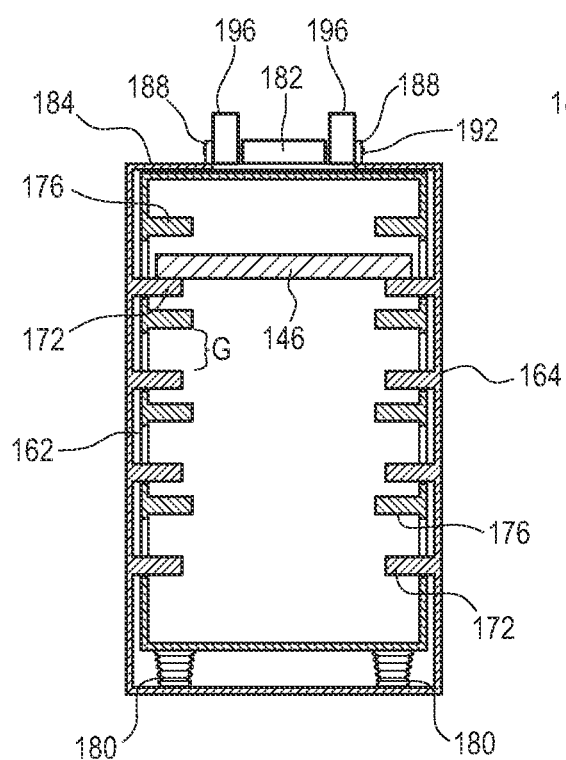
Figure 4E:
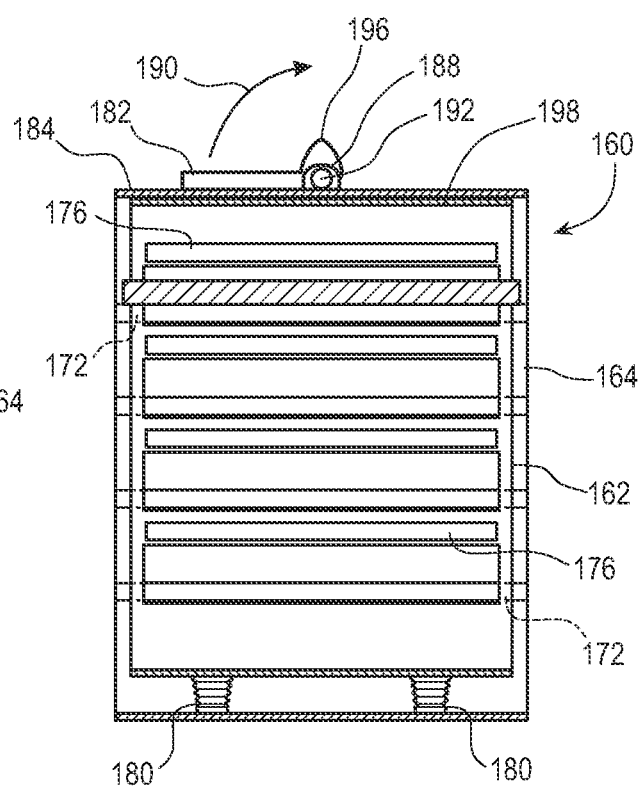
Figure 4F:
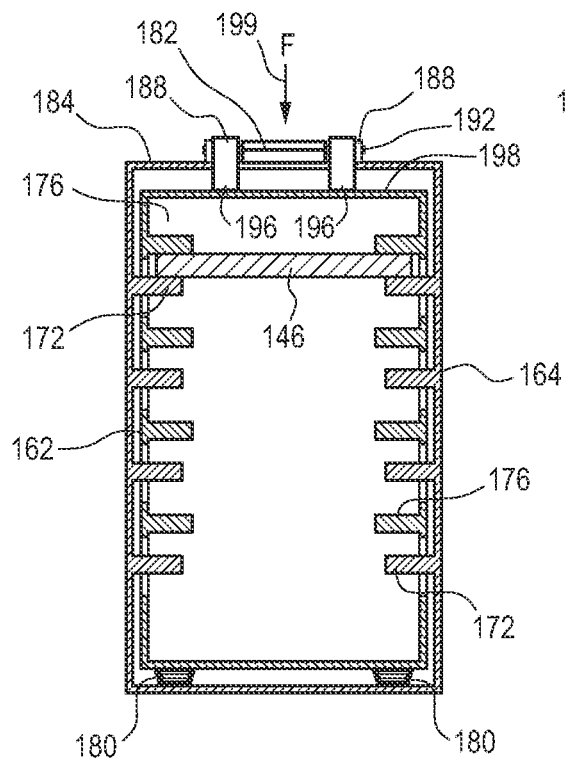
Figure 4G:
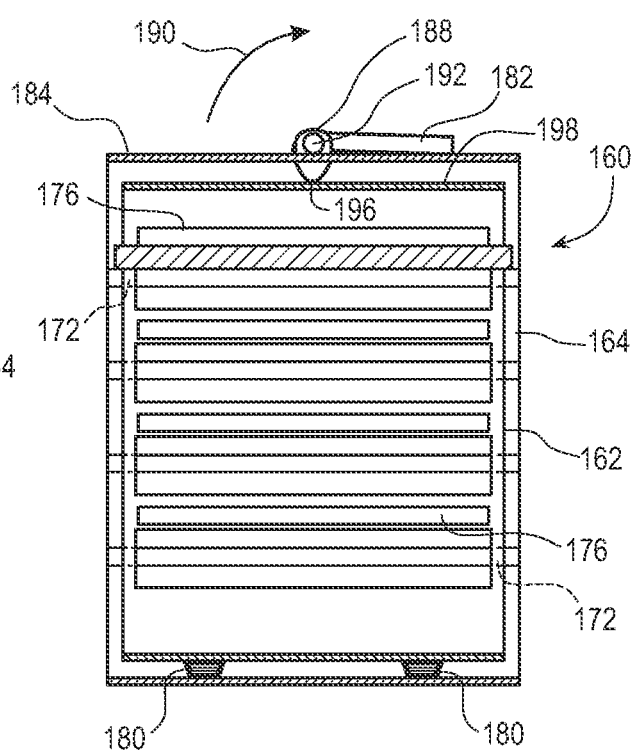

Returning to FIG. 4d, magazine panel holder 160 in shown in a front view with inner case housing 162 in the open position. Upper case extension 176 of inner case housing 162 is in proximity to lower case extension 172 of outer case housing 164, with a sufficient gap G between the lower case extension and upper case extension to permit insertion of reconstituted wafer 146, or semiconductor wafer 100, 110, or substrate strip panel 200. In one embodiment, gap G is 4.0 mm. FIG. 4e is a side view of magazine panel holder 160, outer case housing 162, and inner case housing 164 in the open position. Inner case housing 162 is disposed on springs 180 or other elastic mechanism, such as polymer, liquid, or hydraulic system, as seen in FIGS. 4d-4e. Handle 182 is disposed on top surface 184 of outer case housing 164. Handle 182 is coupled to shaft 192, and the shaft is coupled to cams 188. In FIG. 4d, handle 182 is in the open position to provide gap G between lower case extension 172 of outer case housing 164 and upper case extension 176 of inner case housing 162 to permit insertion of reconstituted wafer 146, or semiconductor wafer 100, 110, or substrate strip panel 200. Lifting and rotating handle 182 in the direction of arrow 190 turns shaft 192 and in turn rotates cams 188. In FIG. 4f, rotating cams 188 causes lobe 196 to contact surface 198 of inner case housing 162 and apply force F on the inner case housing to move the inner case housing in the downward vertical direction of arrow 199. As inner case housing 162 move downward, the inner case housing compresses springs 180 and closes the gap between lower case extension 172 and upper case extension 176, to say 1.0 mm, and brings upper case extension 176 of the inner case housing into contact with surface 178 of reconstituted wafer 146, as shown in FIG. 4g. Cams 188 on surface 198 of inner case housing 162 maintain pressure on inner case housing 162 against springs 180 and on upper case extension 176 of the inner case housing to lock or securely hold reconstituted panel 146 between lower case extension 172 of outer case housing 164 and upper case extension 176 of inner case housing 162. In FIG. 4g, handle 182 is in the closed position so that cams 188 provide pressure on inner case housing 162 against springs 180 and on upper case extension 176 of the inner case housing to lock or securely hold reconstituted panel 146 between lower case extension 172 of outer case housing 164 and upper case extension 176 of inner case housing 162.

Figure 4H:
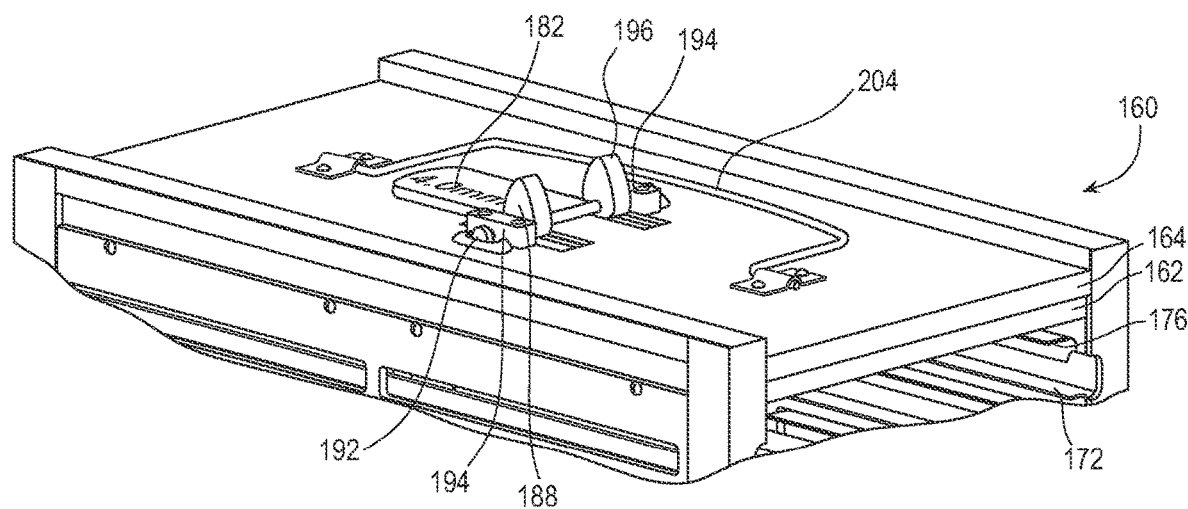
Figure 4I:
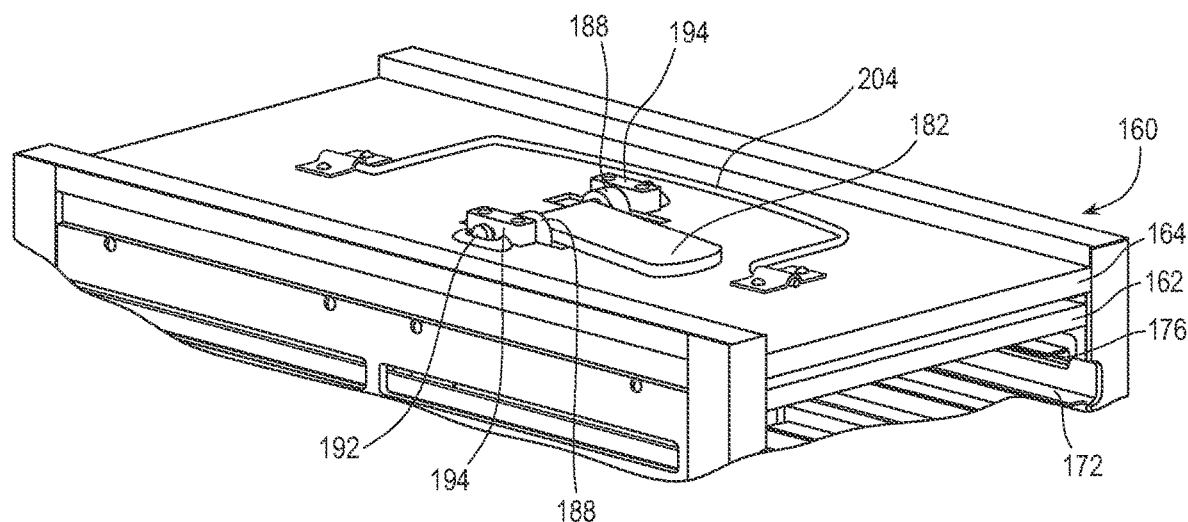

FIG. 4h illustrates handle 182 in the open position to provide gap G between lower case extension 172 of outer case housing 164 and upper case extension 176 of inner case housing 162 to permit insertion of reconstituted wafer 146, as seen in FIG. 4d. Handle 204 provides a convenient manner to transport magazine 160. FIG. 4i illustrates handle 182 in the closed position whereby cams 188 maintain pressure on inner case housing 162 against springs 180 and to close the gap between lower case extension 172 and upper case extension 176. Handle 182 turns shaft 192, which turns cams 188, all held in place with brackets 194. The pressure on upper case extension 176 of the inner case housing locks or securely holds reconstituted panel 146 between lower case extension 172 of outer case housing 164 and upper case extension 176 of inner case housing 162, as seen in FIG. 4i.

Figure 4J:
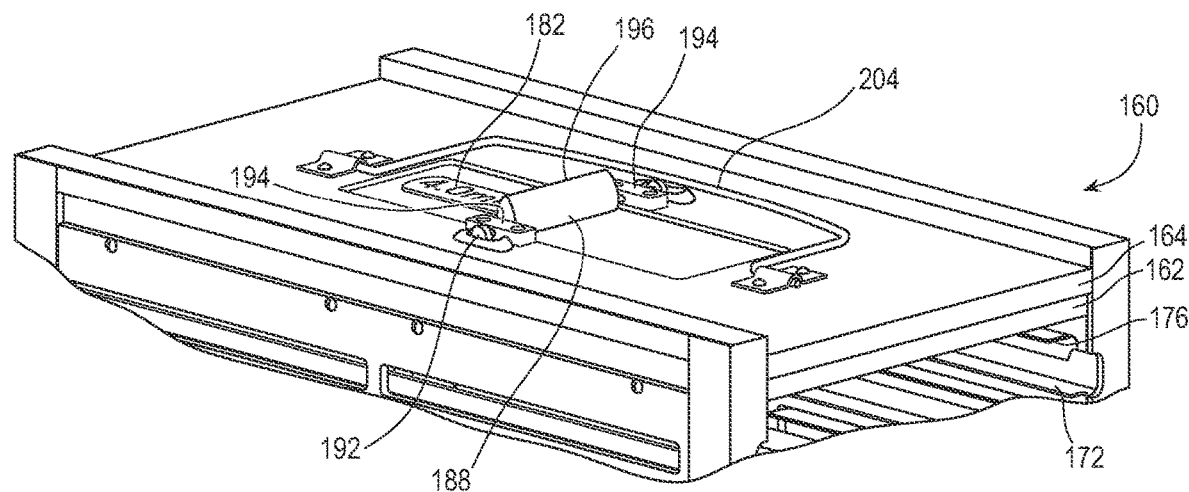

FIG. 4j shows an alternate embodiment of handle 182, cams 188, and shaft 192. Handle 182 turns cams 188 about shaft 192, all held in place by bracket 194.

Figure 4K:
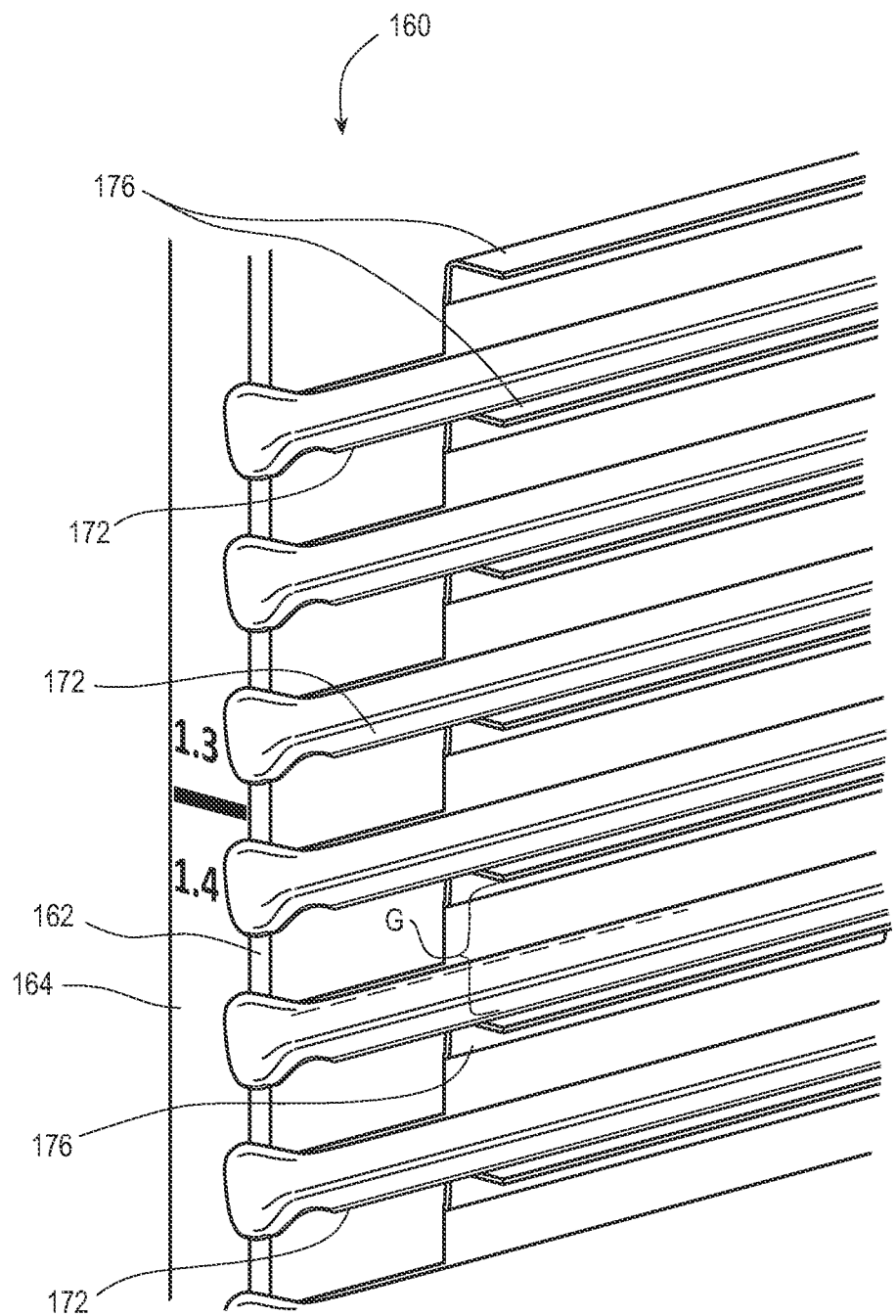
Figure 4L:
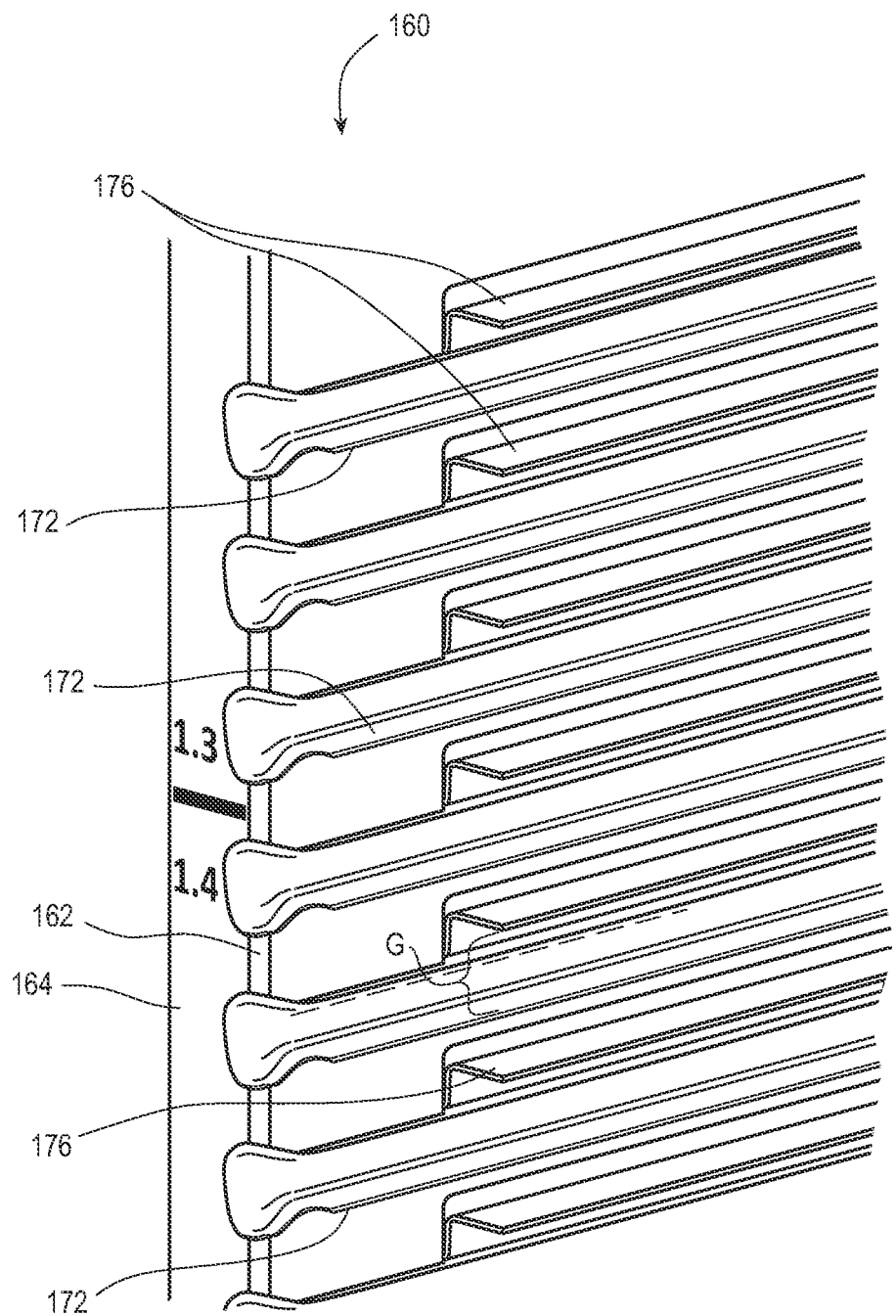

FIG. 4k illustrates further detail of lower case extensions 172 of outer case housing 164 and upper case extensions 176 of inner case housing 162 to permit insertion of reconstituted wafer 146. Handle 182 is in the open position with gap G of about 4.0 mm between lower case extension 172 and upper case extension 176. FIG. 4l illustrates further detail of lower case extensions 172 and upper case extensions 176 in the closed position with gap G of about 1.0 mm between lower case extension 172 and upper case extension 176. The pressure on upper case extension 176 of the inner case housing locks or securely holds reconstituted panel 146 between lower case extension 172 of outer case housing 164 and upper case extension 176 of inner case housing 162.

Figure 4M:
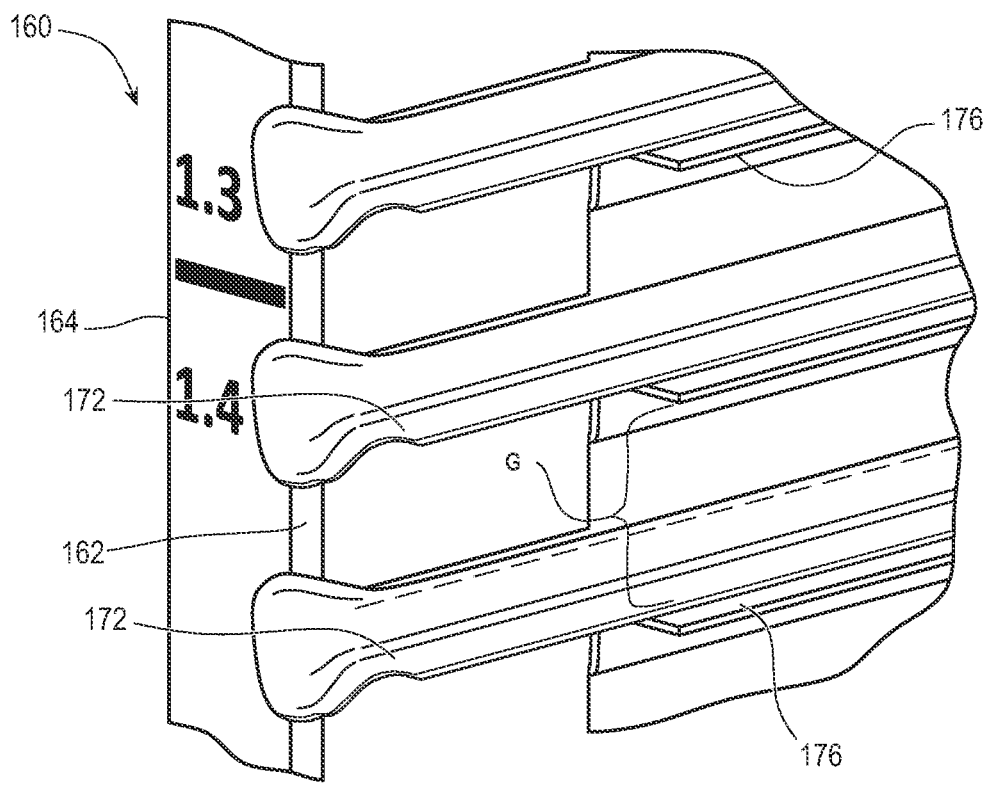
Figure 4N:
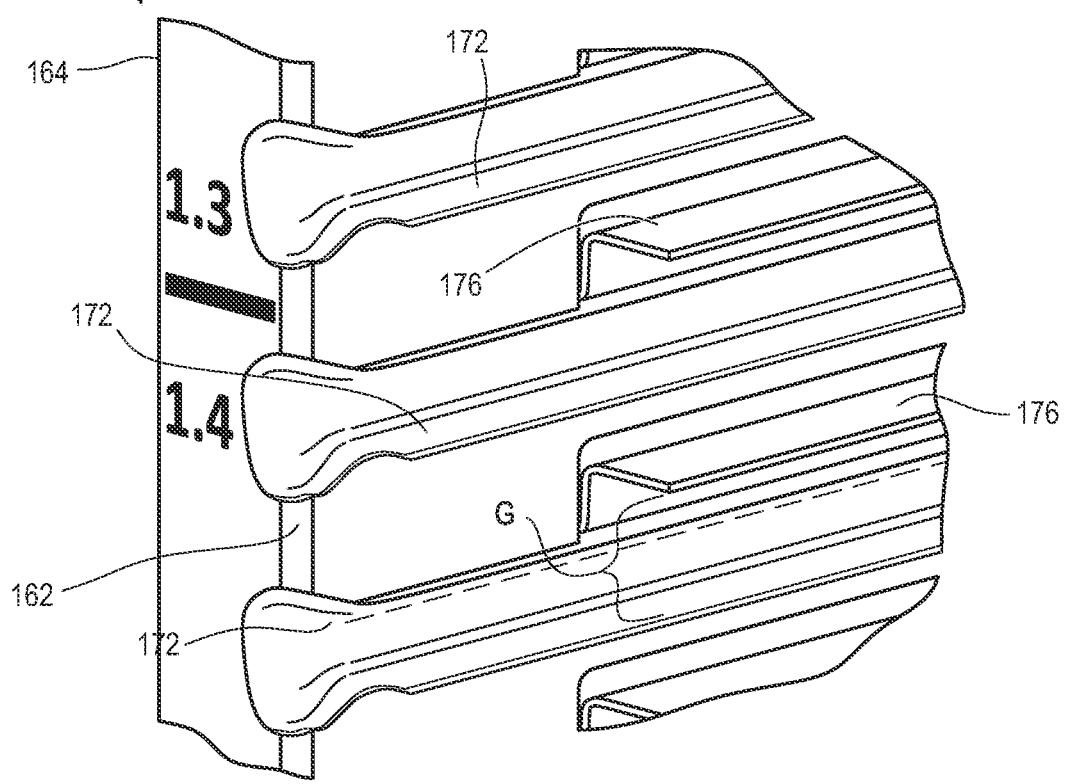

FIG. 4m illustrates even closer detail of lower case extensions 172 of outer case housing 164 and upper case extensions 176 of inner case housing 162 to permit insertion of reconstituted wafer 146. Handle 182 is in the open position with gap G of about 4.0 mm between lower case extension 172 and upper case extension 176. FIG. 4n illustrates even closer detail of lower case extensions 172 and upper case extensions 176 in the closed position with gap G of about 1.0 mm between lower case extension 172 and upper case extension 176. The pressure on upper case extension 176 of the inner case housing locks or securely holds reconstituted panel 146 between lower case extension 172 of outer case housing 164 and upper case extension 176 of inner case housing 162.

The pressure on upper case extension 176 of inner case housing 162 from cams 188, securely holding reconstituted panel 146 between lower case extension 172 and upper case extension 176, reduces the chance of warping of the reconstituted panel during heat cycling. In addition, securely holding reconstituted panel 146 between lower case extension 172 and upper case extension 176 reduces the risk of damage to the reconstituted panels during handling, particularly transporting magazine 160 from one location to another. The closure mechanism provided by handle 182 is simple to operate. The dimensions of magazine 160 accommodate any reconstitute panel, particularly when the reconstitute panels are a standard size for all semiconductor die, as described herein. Magazine 160 can accommodate other sizes of reconstituted panels.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor manufacturing equipment, comprising:
   providing an outer case housing including a lower case extension adapted to support a semiconductor panel;
   providing an inner case housing including an upper case extension, wherein the inner case housing is moveable with respect to the outer case housing;
   inserting the inner case housing into the outer case housing so that the upper case extension is in proximity to the lower case extension; and
   providing a mechanism to assert pressure on the inner case housing and upper case extension to move the inner case housing and upper case extension with respect to the upper case housing and lower case extension and lock the semiconductor panel between the upper case extension and lower case extension.

2. The method of claim 1, further including disposing a cam assembly above the inner case housing to apply pressure to the inner case housing and upper case extension to lock the semiconductor panel between the upper case extension and lower case extension.

3. The method of claim 2, further including providing a handle to rotate the cam assembly and apply pressure to the inner case housing and upper case extension to lock the semiconductor panel between the upper case extension and lower case extension.

4. The method of claim 2, further including providing an elastic mechanism under the inner case housing to load the pressure.

5. The method of claim 4, wherein the elastic mechanism includes a spring.

6. A method of making a semiconductor manufacturing equipment, comprising:
   providing an outer case housing including a lower case extension adapted to support a semiconductor panel;
   providing an inner case housing including an upper case extension;
   inserting the inner case housing into the outer case housing to have the upper case extension in proximity to the lower case extension; and
   providing a mechanism to move the inner case housing and upper case extension with respect to the outer case housing and lower case extension and lock the semiconductor panel in place between the upper case extension and lower case extension.

7. The method of claim 6, further including disposing a cam assembly above the inner case housing to apply pressure to the inner case housing and upper case extension to move the upper case extension toward the lower case extension and lock the semiconductor panel in place between the upper case extension and lower case extension.

8. The method of claim 7, further including providing a handle to rotate the cam assembly and apply pressure to the inner case housing and upper case extension to move the upper case extension toward the lower case extension and lock the semiconductor panel in place between the upper case extension and lower case extension.

9. The method of claim 7, further including providing an elastic mechanism under the inner case housing to load the pressure.

10. The method of claim 9, wherein the elastic mechanism includes a spring.

11. The method of claim 6, wherein the lower case extension is fixed in position within the outer case housing.

12. A semiconductor manufacturing equipment, comprising:
- an outer case housing including a lower case extension adapted to support a semiconductor panel;
- an inner case housing including an upper case extension, wherein the inner case housing is insertable into the outer case housing with the upper case extension in proximity to the lower case extension; and
- a mechanism adapted to assert pressure on the inner case housing and upper case extension to move the inner case housing with respect to the upper case housing and lock the semiconductor panel between the upper case extension and lower case extension.

13. The semiconductor manufacturing equipment of claim 12, further including a cam assembly disposed above the inner case housing to apply pressure to the inner case housing and upper case extension to lock the semiconductor panel between the upper case extension and lower case extension.

14. The semiconductor manufacturing equipment of claim 13, further including a handle to rotate the cam assembly and apply pressure to the inner case housing and upper case extension to lock the semiconductor panel between the upper case extension and lower case extension.

15. The semiconductor manufacturing equipment of claim 13, further including an elastic mechanism disposed under the inner case housing to load the pressure.

16. The semiconductor manufacturing equipment of claim 15, wherein the elastic mechanism includes a spring.

17. A semiconductor manufacturing equipment, comprising:
- an outer case housing including a lower case extension adapted to support a semiconductor panel;
- an inner case housing including an upper case extension, wherein the inner case housing is insertable into the outer case housing to have the upper case extension in proximity to the lower case extension; and
- a mechanism adapted to move the inner case housing and upper case extension with respect to the outer case housing and lower case extension and lock the semiconductor panel in place between the upper case extension and lower case extension.

18. The semiconductor manufacturing equipment of claim 17, further including a cam assembly disposed above the inner case housing to apply pressure to the inner case housing and upper case extension to move the upper case extension toward the lower case extension and lock the semiconductor panel in place between the upper case extension and lower case extension.

19. The semiconductor manufacturing equipment of claim 18, further including a handle to rotate the cam assembly and apply pressure to the inner case housing and upper case extension to move the upper case extension toward the lower case extension and lock the semiconductor panel in place between the upper case extension and lower case extension.

20. The semiconductor manufacturing equipment of claim 18, further including an elastic mechanism disposed under the inner case housing to load the pressure.

21. The semiconductor manufacturing equipment of claim 20, wherein the elastic mechanism includes a spring.

* * * * *